(12) United States Patent
Yoshida et al.

(10) Patent No.: US 10,615,251 B2
(45) Date of Patent: Apr. 7, 2020

(54) SEMICONDUCTOR DEVICE AND MANUFACTURING METHOD THEREOF

(71) Applicant: Renesas Electronics Corporation, Tokyo (JP)

(72) Inventors: Yoshinori Yoshida, Tokyo (JP); Tsuyoshi Kachi, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/019,808

(22) Filed: Jun. 27, 2018

(65) Prior Publication Data

US 2019/0043943 A1    Feb. 7, 2019

(30) Foreign Application Priority Data

Aug. 7, 2017  (JP) .................. 2017-152430

(51) Int. Cl.

| | |
|---|---|
| *H01L 29/06* | (2006.01) |
| *H01L 23/00* | (2006.01) |
| *H01L 21/225* | (2006.01) |
| *H01L 29/78* | (2006.01) |

(Continued)

(52) U.S. Cl.
CPC ........ *H01L 29/0634* (2013.01); *H01L 21/225* (2013.01); *H01L 23/562* (2013.01); *H01L 29/0615* (2013.01); *H01L 29/0653* (2013.01); *H01L 29/1095* (2013.01); *H01L 29/4236* (2013.01); *H01L 29/7811* (2013.01);
(Continued)

(58) Field of Classification Search
CPC ............. H01L 29/0634; H01L 29/0615; H01L 29/0653; H01L 29/1095; H01L 29/4236; H01L 29/7811; H01L 29/7827; H01L 29/0638; H01L 29/7809; H01L 21/225; H01L 23/562
USPC ........................................................ 257/288
See application file for complete search history.

(56) References Cited

U.S. PATENT DOCUMENTS

| | | | |
|---|---|---|---|
| 9,082,845 B1 * | 7/2015 | Seok | .................... H01L 29/7811 |
| 9,209,249 B2 | 12/2015 | Kachi | |

(Continued)

FOREIGN PATENT DOCUMENTS

| | | |
|---|---|---|
| EP | 1 267 415 A2 | 12/2002 |
| JP | 2014-154596 A | 8/2014 |

OTHER PUBLICATIONS

Extended European Search Report received in corresponding European Application No. 18184375.6 dated Dec. 19, 2018.

*Primary Examiner* — Tong-Ho Kim
(74) *Attorney, Agent, or Firm* — Mattingly & Malur, PC

(57) ABSTRACT

A semiconductor substrate is easily warped by the shrink of the insulating film formed within the deep trench according to the thermal processing in the super junction structure. In order to solve the above problem, in a semiconductor device, an element region and a terminal region are defined on one main surface of the semiconductor substrate. The terminal region is arranged to surround the element region. In the terminal region, a plurality of buried insulators are formed from the main surface of the semiconductor substrate in a way of penetrating an n-type diffusion layer and an n-type column layer and arriving at an n-type epitaxial layer. The buried insulator is formed within a deep trench. The plural buried insulators are arranged in island shapes mutually at a distance from each other.

12 Claims, 32 Drawing Sheets

(51) Int. Cl.
*H01L 29/423* (2006.01)
*H01L 29/10* (2006.01)

(52) U.S. Cl.
CPC ...... *H01L 29/7827* (2013.01); *H01L 29/0638* (2013.01); *H01L 29/7809* (2013.01)

(56) References Cited

U.S. PATENT DOCUMENTS

| | | |
|---|---|---|
| 2002/0185705 A1* | 12/2002 | Saitoh ................. H01L 21/3247 257/492 |
| 2010/0025760 A1 | 2/2010 | Kawashima |
| 2010/0230745 A1* | 9/2010 | Saito ................... H01L 29/0619 257/329 |
| 2012/0098057 A1 | 4/2012 | Kim et al. |
| 2014/0264619 A1* | 9/2014 | Sugiura ............... H01L 29/0696 257/368 |
| 2016/0005809 A1* | 1/2016 | Bobde ................. H01L 29/0615 257/491 |

\* cited by examiner

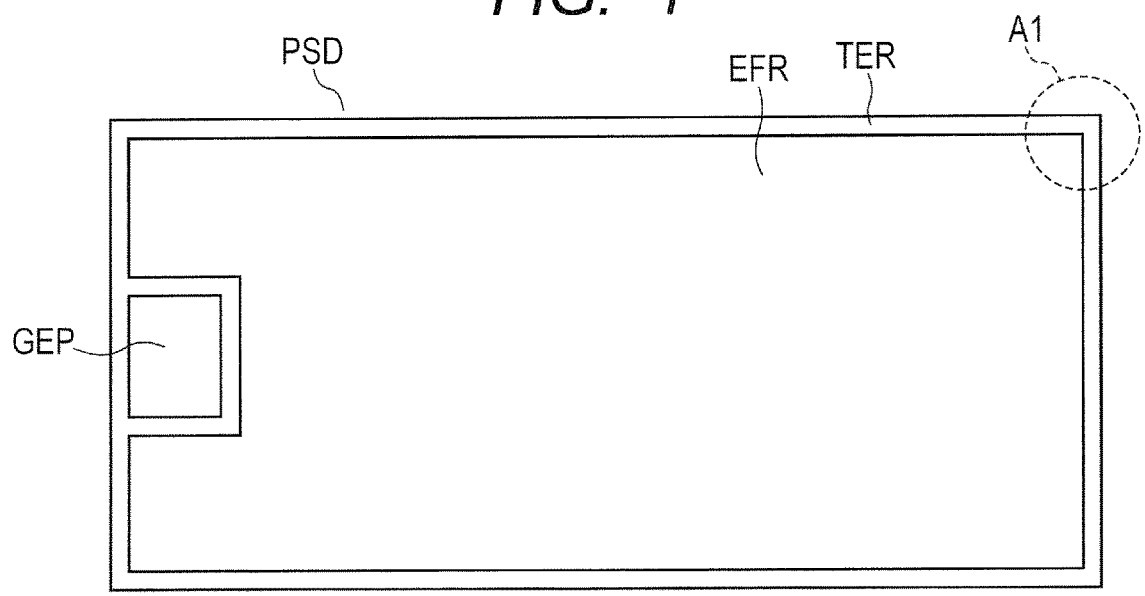
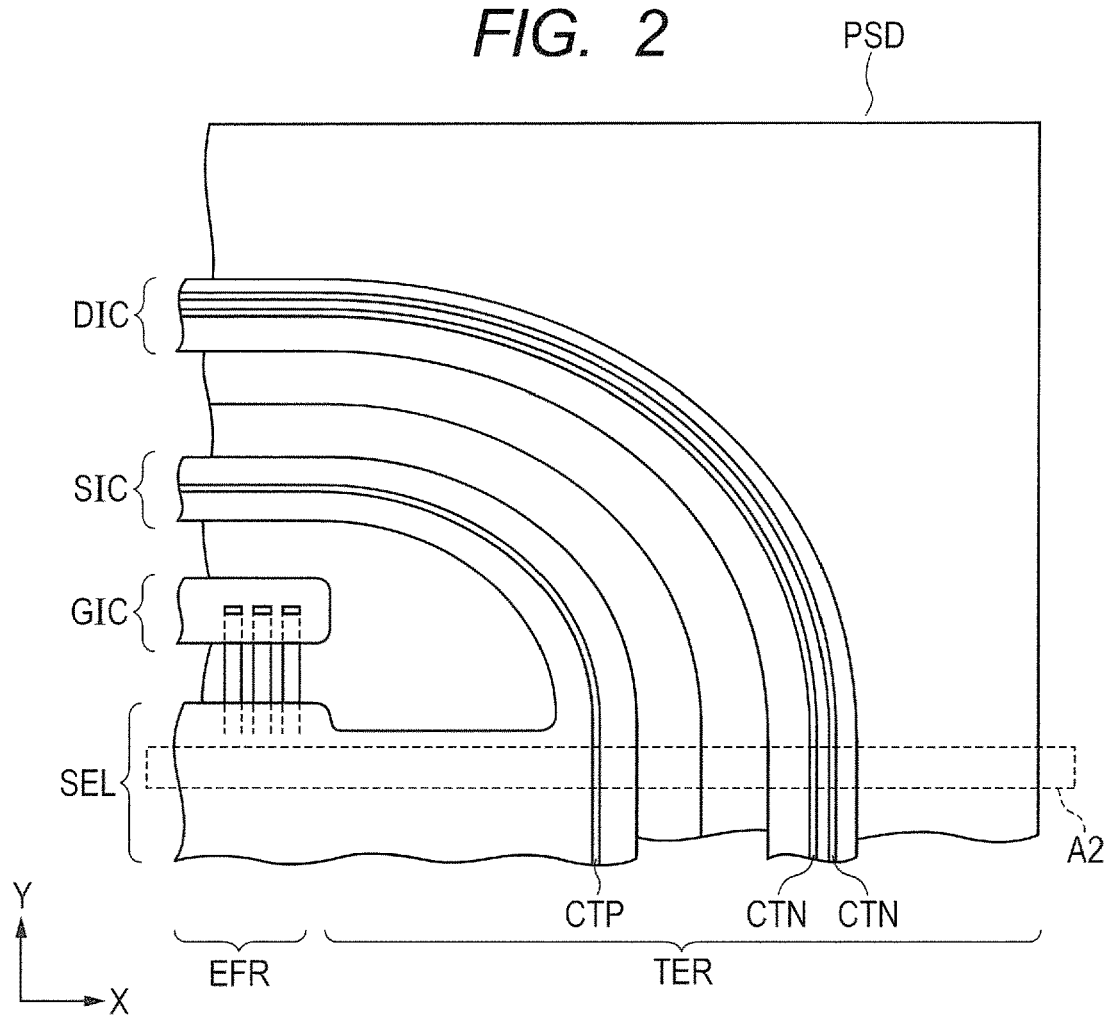

DTC, ZOF

DTC, ZOF

DTC,ZOF

DTC,ZOF

DTC,ZOF    DTC,ZOF

DTC,ZOF

SEMICONDUCTOR DEVICE AND MANUFACTURING METHOD THEREOF

CROSS-REFERENCE TO RELATED APPLICATIONS

The disclosure of Japanese Patent Application No. 2017-152430 filed on Aug. 7, 2017 including the specification, drawings and abstract is incorporated herein by reference in its entirety.

BACKGROUND

The invention relates to a semiconductor device and a manufacturing method thereof, and particularly, it is suitably applied to a semiconductor device having a super junction structure.

A semiconductor device of a power system adopts a super junction structure as a structure for achieving a lower conductive resistance and a higher junction withstand voltage by arranging pn junctions periodically. To assure a withstand voltage, a semiconductor device of this kind is formed so that a terminal region may surround an element region where power semiconductor elements such as Metal Oxide Semiconductor Field Effective Transistor (MOSFET) are formed. The patent document, for example, Japanese Unexamined Patent Application Publication No. 2014-154596 discloses this kind of semiconductor device.

In the super junction structure, a comparatively deeper groove (deep trench) is formed and through the deep trench, n-type dopant and p-type dopant are injected there; as the result, the pn junctions are arranged periodically. The deep trenches are formed also in the terminal region as well as in the element region. After forming the periodical pn junctions, an insulating film is formed within each deep trench, for example, according to the Chemical Vapor Deposition (CVD).

SUMMARY

For example, when forming MOSFET in a manufacturing process of a semiconductor device, a protective insulating film is formed after forming the insulating film within the deep trench, to reduce a damage caused by the injection. The protective insulating film is formed by the thermal oxidation processing. The insulating film formed within the deep trench tends to shrink according to the thermal oxidation processing.

Particularly, in the super junction structure, a semiconductor substrate is likely to warp downwardly because of shrinkage of the insulating film formed within the comparatively deep trench. The warp of the semiconductor substrate causes some disadvantages in the later processes such as carrying error in a semiconductor manufacturing device.

Other objects and novel characteristics will be apparent from the description of the specification and the attached drawings.

A semiconductor device according to one embodiment includes a semiconductor substrate, an element region, a semiconductor element, a terminal region, a first region, a plurality of first buried insulators, and a first column layer. The semiconductor substrate has a first main surface and a second main surface: on the side of the second main surface, a substrate of a first conductive type is provided and on the side of the first main surface, a semiconductor layer of a second conductivity type is provided. The element region is defined on the side of the first main surface of the semiconductor substrate. The semiconductor element is formed in the element region to conduct current between the first main surface and the second main surface. The terminal region is defined on the side of the first main surface of the semiconductor substrate and arranged to surround the element region. The first region of the first conductive type is formed in the terminal region, to arrive at the substrate from the first main surface. The plural first buried insulators are formed in the terminal region, to arrive at a first depth from the first main surface. The first column layer of the second conductivity type is formed in contact with the first region and the respective first buried insulators, having a first dopant concentration. The plural first buried insulators are arranged in island shapes at a distance from each other.

A manufacturing method of a semiconductor device according to another embodiment includes the following steps. There is provided with a semiconductor substrate having a first main surface and a second main surface, including a semiconductor layer of the second conductivity type on the side of the first main surface and a substrate of the first conductivity type in contact with the semiconductor layer on the side of the second main surface. An element region and a terminal region are defined on the side of the first main surface of the semiconductor substrate. A plurality of first deep trenches are formed, arriving at a first depth from the first main surface mutually at a distance from each other, in the terminal region and a second deep trench is formed, arriving at the first depth from the first main surface, in the element region. A first region of the first conductivity type is formed, arriving at the substrate from the first main surface, in the terminal region and a second region of the first conductivity type is formed, arriving at the substrate from the first main surface, in the element region, by introducing the first dopant of the first conductivity type through the plural first deep trenches and the second deep trench. A first column layer of the second conductivity type in contact with the first region is formed along the respective side wall surfaces of the plural first deep trenches, in the terminal region and a second column layer of the second conductivity type in contact with the second region is formed along the side wall surface of the second deep trench, in the element region, by introducing the second dopant of the second conductivity type through the plural first deep trenches and the second deep trench. First buried insulators are formed respectively within the plural first deep trenches and a second buried insulator is formed within the second deep trench. A semiconductor element of conducting current between the first main surface and the second main surface is formed in the element region. An interlayer insulating film is formed to cover the first buried insulators and the second buried insulator. A first opening portion is formed in the interlayer insulating film positioned in the terminal region and a second opening portion is formed in the interlayer insulating film positioned in the element region. A first electrode electrically coupled to the substrate of the semiconductor substrate through the first region and a portion filled in the first opening portion is formed in the terminal region and a second electrode electrically coupled to the semiconductor element through the portion filled in the second opening portion is formed in the element region.

A semiconductor device according to one embodiment can diminish the warp of a semiconductor substrate. In a manufacturing method of the semiconductor device according to another embodiment, it is possible to diminish the warp of a semiconductor substrate.

BRIEF DESCRIPTION OF THE DRAWINGS

FIG. 1 is a top plan view showing one example of a plane pattern of a semiconductor device according to each embodiment.

FIG. 2 is a partially enlarged top plan view showing one example of a plane pattern within a dotted frame A1 indicated in FIG. 1, in the semiconductor device according to a first embodiment.

DETAILED DESCRIPTION

First Embodiment

A first example of a semiconductor device where buried insulators (deep trenches) are formed in a shape of island in a terminal region will be described.

At first, a plane structure of a semiconductor device will be described according to FIGS. 1 and 2. FIG. 2 shows one example of the plane pattern within a dotted frame A1 shown in FIG. 1. As shown in FIGS. 1 and 2, an element region EFR, a terminal region TER, and a gate electrode pad GEP are defined on one main surface (first surface) of a semiconductor substrate SUB (refer to FIG. 4) in a semiconductor device PSD. The terminal region TER is arranged to surround the element region EFR. A gate wiring GIC, a source electrode SEL, and a source wiring SIC are formed in the element region EFR.

The gate wiring GIC is electrically coupled to the gate electrode pad GEP. Wires (not illustrated) are bonded to the source electrode SEL. A drain wiring DIC is formed in the terminal region TER. The drain wiring DIC is formed to surround the source wiring SIC.

Figure 3:
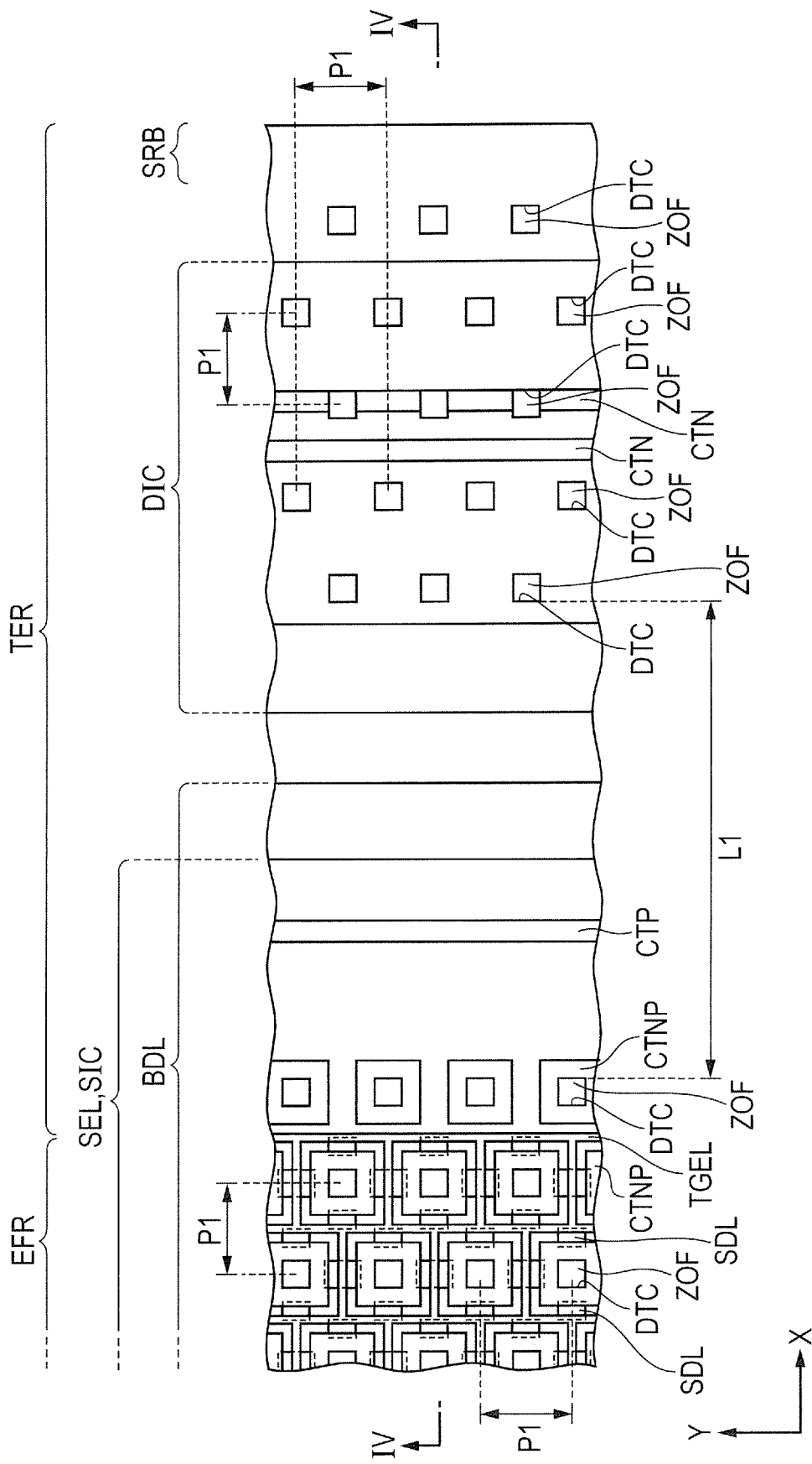
FIG. 3 is a partially enlarged top plan view showing one example of a plane pattern within a dotted frame A2 indicated in FIG. 2, according to the embodiment.
Figure 4:
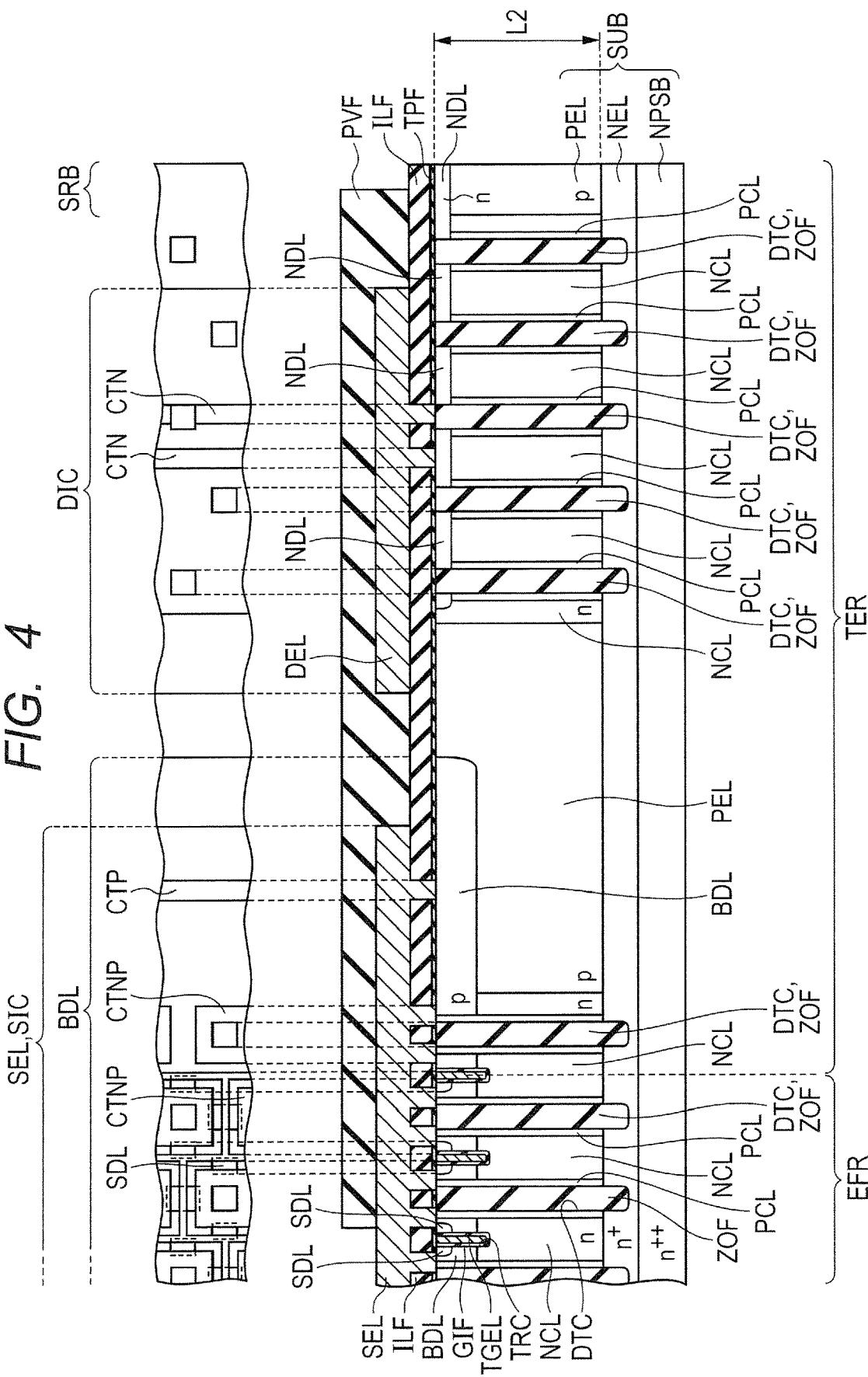
FIG. 4 is a cross-sectional view taken along the sectional line IV-IV shown in FIG. 3, in correspondence with the top plan view shown in FIG. 3, according to the embodiment.

Next, the plane structure and the cross-sectional structure will be specifically described according to FIGS. 3 and 4. FIG. 3 shows one example of the plane pattern within a dotted frame A2 shown in FIG. 2. As shown in FIGS. 3 and 4, a semiconductor substrate SUB includes an $n^{++}$-type substrate NPSB, an n-type epitaxial layer NEL, and a p-type epitaxial layer PEL. The $n^{++}$-type substrate NPSB (substrate) is positioned on the other surface (second surface) of the semiconductor substrate SUB.

The MOSFET is formed in the element region EFR as a semiconductor element. A p-type base diffusion layer BDL is formed in a predetermined depth from one surface of the semiconductor substrate SUB. The base diffusion layer BDL is formed to extend to the terminal region TER. An n-type column layer NCL (second region) is formed from the bottom of the base diffusion layer BDL, arriving at the n-type epitaxial layer NEL.

A gate trench TRC is formed on the main surface of the semiconductor substrate in a way of penetrating the base diffusion layer BDL and arriving at the n-type column layer NCL. A gate electrode TGEL is formed within the gate trench TRC through a gate insulating film GIF. The gate electrode TGEL is arranged in a shape of mesh. An n-type source diffusion layer SDL is formed in the base diffusion layer BDL at a shallow position from the main surface of the semiconductor substrate SUB upper from the bottom of the base diffusion layer BDL. The n-type source diffusion layer SDL is formed on the lateral side of the gate trench TRC.

A plurality of buried insulators ZOF (second buried insulators) are formed on the main surface of the semiconductor substrate SUB in a way of penetrating the base diffusion layer BDL and the n-type column layer NCL and arriving at the n-type epitaxial layer NEL. The buried insulator ZOF is formed within the deep trench DTC. The plural buried insulators ZOF are arranged in island shapes mutually at a distance from each other. The plural buried insulators ZOF are formed in each region surrounded by the gate electrode TGEL formed in a mesh shape in a planar view.

The pitch of the buried insulators ZOF in the horizontal direction (X-axis direction) and the pitch of the buried insulators ZOF in the vertical direction (Y-axis direction) are set at the same pitch P1. A p-type column layer PCL is formed in contact with the buried insulator ZOF. The p-type column layer PCL is also in contact with the n-type column layer NCL. The p-type column layer PCL and the n-type column layer NCL are alternately arranged as the super junction structure.

A protective insulating film TPF and an interlayer insulating film ILF are formed to cover the element region EFR. The source electrode SEL (second electrode) is formed to cover the interlayer insulating film ILF. The source electrode SEL is electrically coupled to the source diffusion layer SDL through a contact CTNP. The source electrode SEL is electrically coupled to the base diffusion layer BDL through the contacts CTP and CTNP.

Next, in the terminal region TER, an n-type diffusion layer NDL (first dopant layer) is formed at a predetermined depth from the main surface of the semiconductor substrate SUB. The n-type column layer NCL (first region) is formed in a way of arriving at the n-type epitaxial layer NEL from the bottom of the n-type diffusion layer NDL. The plural buried insulators ZOF (first buried insulators) are formed on the main surface of the semiconductor substrate SUB in a way of penetrating the n-type diffusion layer NDL and the n-type column layer NCL and arriving at the n-type epitaxial layer NEL. The buried insulator ZOF is formed within the deep trench DTC. The plural buried insulators ZOF are arranged in island shapes mutually at a distance from each other.

The pitch of the buried insulators ZOF in the horizontal direction (X-axis direction) and the pitch of the buried insulators ZOF in the vertical direction (Y-axis direction) are set at the same pitch P1. The p-type column layer PCL is formed in contact with the buried insulator ZOF. The p-type column layer PCL is also in contact with the n-type column layer NCL. The p-type column layer PCL and the n-type column layer NCL are alternately arranged as the super junction structure.

A p-type epitaxial layer PEL (second dopant layer) as an isolation region is positioned between the buried insulator ZOF (buried insulator first portion) nearest to the element region EFR, of the buried insulators ZOF and the buried insulator ZOF (buried insulator second portion) positioned at a distance from the above buried insulator ZOF in a direction distant far away from the element region EFR. The base diffusion layer BDL is positioned to extend from the element region EFR to the p-type epitaxial layer PEL. Any buried insulator is not arranged in the region having the p-type epitaxial layer PEL.

A distance L1 between the buried insulator ZOF nearest to the element region EFR and the buried insulator ZOF positioned at a distance from the above buried insulator ZOF in a direction distant far away from the element region EFR is set longer than the length corresponding to a thickness L2 of the p-type epitaxial layer PEL. For example, in the case of the withstand voltage of 100 V, the thickness L2 is supposed to be about 10 μm and the distance L1 is supposed to be some tens μm and more. According to the rise of the withstand voltage, the thickness L2 gets thicker.

The protective insulating film TPF and the interlayer insulating film ILF are formed to cover the terminal region TER. A drain electrode DEL (first electrode) is formed to cover the interlayer insulating film ILF. The drain electrode DEL is electrically coupled to the n-type diffusion layer NDL through the contact CTN. Further, the n-type diffusion layer NDL is electrically coupled to the $n^{++}$-type substrate NPSB through the n-type column layer NCL and the n-type epitaxial layer NEL. Thus, the drain electrode DEL is electrically coupled to the $n^{++}$-type substrate NPSB. A passivation film PVF is formed to cover the source electrode SEL and the drain electrode DEL.

The $n^{++}$-type substrate NPSB becomes a substantial drain electrode in the semiconductor device PSD. In the MOSFET, current is conducted between the source electrode SEL positioned on the main surface of the semiconductor substrate SUB and the $n^{++}$-type substrate NPSB positioned on the other surface. By electrically coupling the drain electrode DEL positioned on the main surface of the semiconductor substrate SUB to the $n^{++}$-type substrate NPSB positioned on the other surface of the semiconductor substrate SUB, the potential of the element region EFR can be stabilized.

Next, one example of a manufacturing method of the above-mentioned semiconductor device will be described. At first, a semiconductor substrate SUB (refer to FIG. 5) having the $n^{++}$-type substrate NPSB, the n-type epitaxial layer NEL, and the p-type epitaxial layer PEL is provided.

A gate trench (not illustrated) having a predetermined depth from the surface of the p-type epitaxial layer PEL is formed in the element region EFR defined on the main surface of the semiconductor substrate SUB. Next, a silicon oxide film (not illustrated) is formed on the surface of the p-type epitaxial layer PEL including the bared portion of the p-type epitaxial layer PEL in the gate trench, according to the thermal oxidation processing. Then, a polysilicon film (not illustrated) is formed to fill the gate trench.

Figure 5:
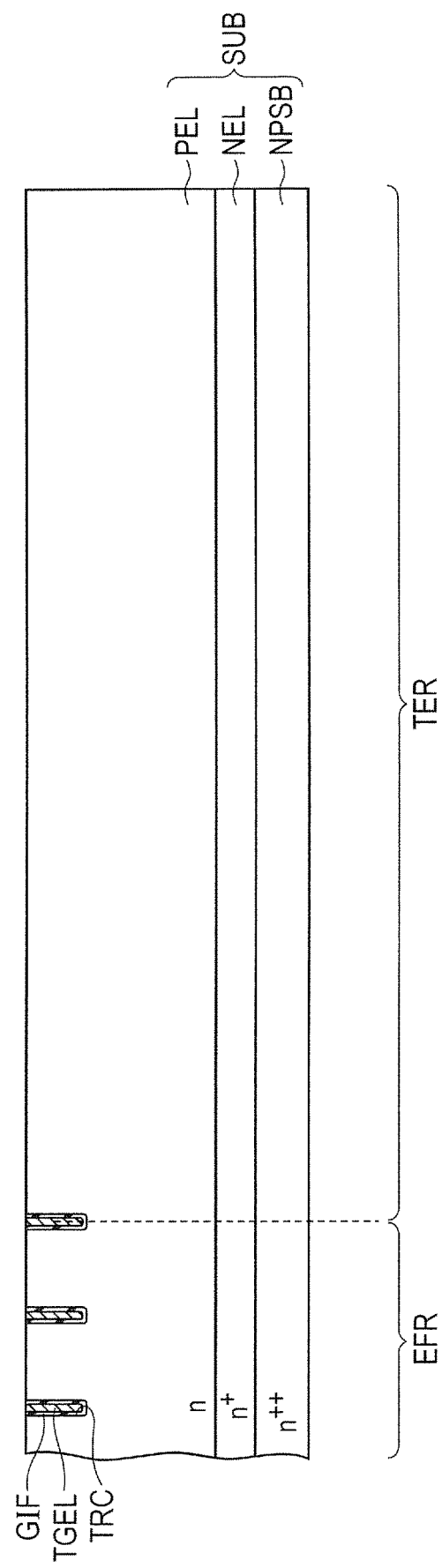
FIG. 5 is a cross-sectional view showing one process of a manufacturing method of a semiconductor device, according to the embodiment.

The silicon oxide film portion and the polysilicon film portion positioned on the top surface of the p-type epitaxial layer PEL are eliminated. According to this, as shown in FIG. 5, the silicon oxide film portion left within the gate trench TRC is formed as the gate insulating film GIF. The polysilicon film portion left within the gate trench TRC is formed as the gate electrode TGEL.

A protective insulating film IPF (refer to FIG. 6) is formed on the surface of the p-type epitaxial layer PEL according to the thermal processing. The deep trenches DTC are formed in the element region EFR and the terminal region, according to predetermined photoengraving and etching processing (refer to FIG. 6). The deep trench DTC is formed from the surface of the p-type epitaxial layer PEL in a way of penetrating the p-type epitaxial layer PEL and arriving at the n-type epitaxial layer NEL (refer to FIG. 6). The deep trenches DTC are formed in island shapes mutually at a distance from each other.

Figure 6:
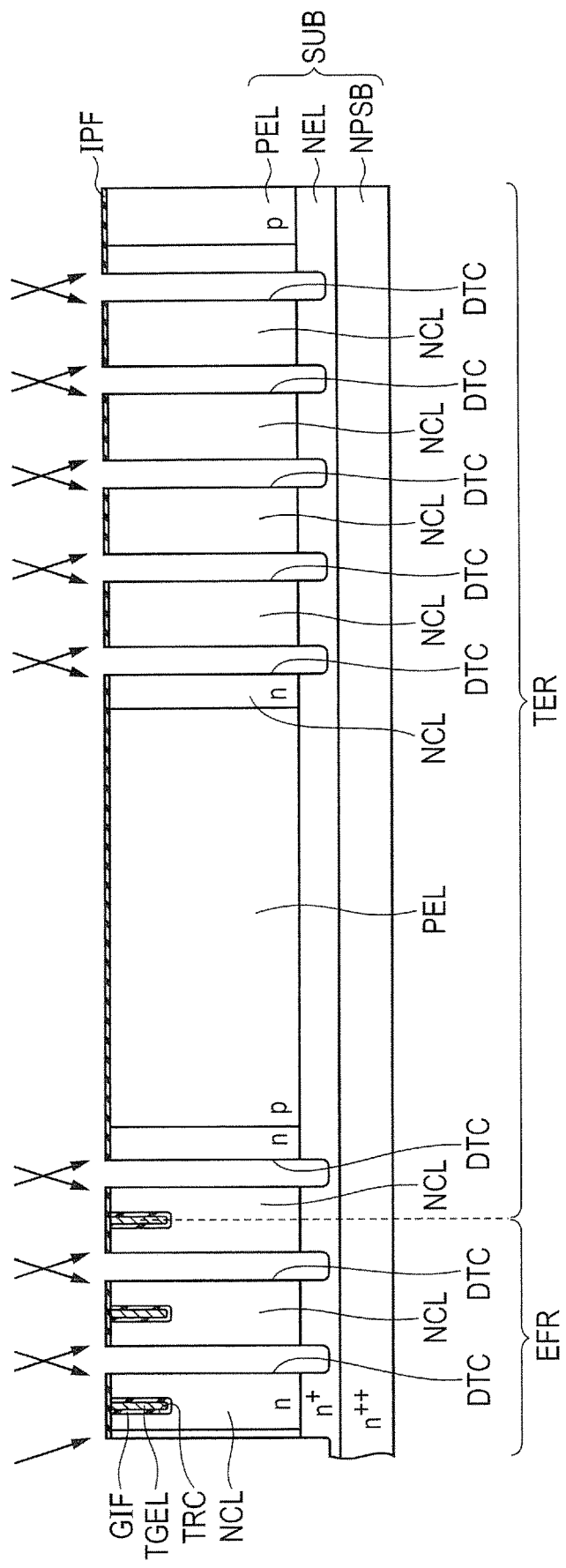
FIG. 6 is a cross-sectional view showing the process performed after the process shown in FIG. 5, according to the embodiment.

The n-type dopant is injected there from the oblique direction through the protective insulating film IPF and the deep trench DTC. A photoresist pattern (not illustrated) is formed to cover a part of the terminal region. With the photoresist pattern as an injection mask, the n-type dopant is injected obliquely. After eliminating the photoresist pattern, as shown in FIG. 6, the n-type column layer NCL is formed respectively in the element region EFR and a predetermined region of the terminal region TER according to the thermal processing.

Figure 7:
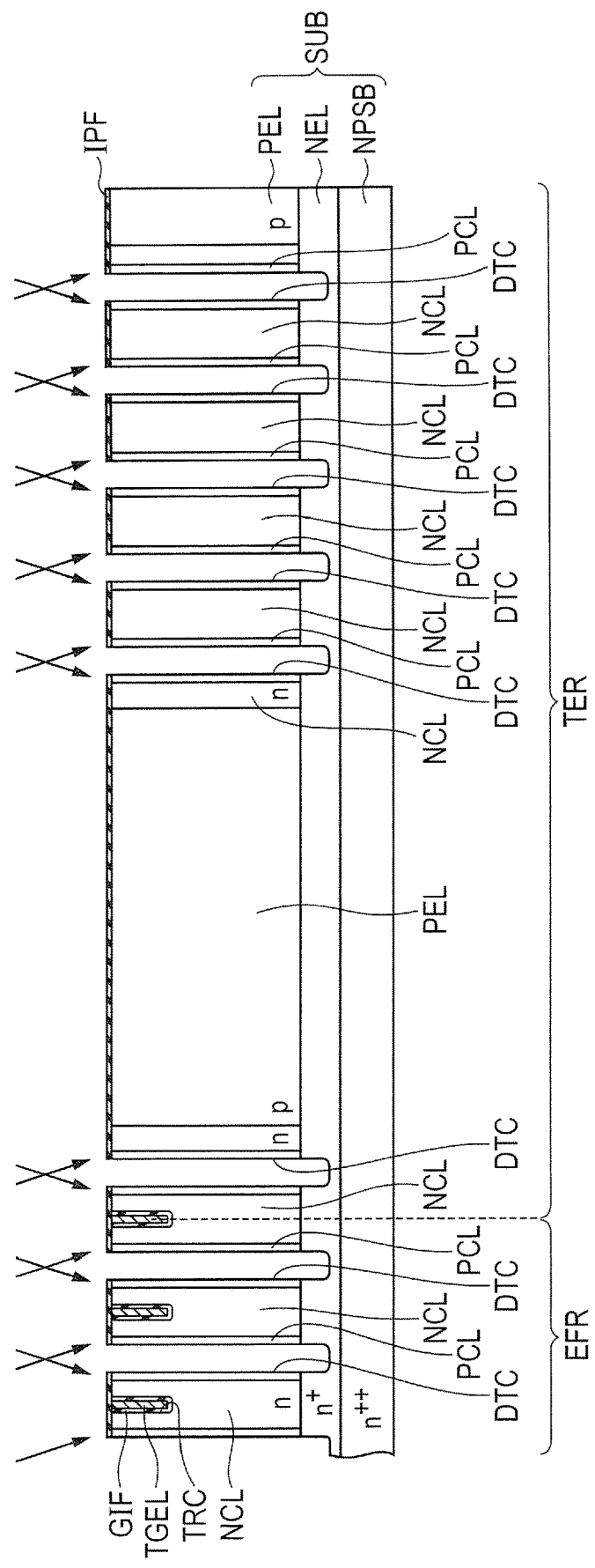
FIG. 7 is a cross-sectional view showing the process performed after the process shown in FIG. 6, according to the embodiment.

Next, a photoresist pattern (not illustrated) is formed to cover the terminal region TER. With the photoresist pattern as the injection mask, the p-type dopant is injected. After eliminating the photoresist pattern, as shown in FIG. 7, the p-type column layer PCL is formed along the lateral side wall of the deep trench DTC at each predetermined region in the element region EFR and the terminal region TER, according to the thermal processing. The p-type column layer PCL is in contact with the n-type column layer NCL.

Then, a silicon oxide film (not illustrated) is formed to fill the deep trench DTC, for example, according to the CVD method. Next, the silicon oxide film portion positioned on the surface of the semiconductor substrate SUB other than the silicon oxide film portions positioned within the deep trench DTC is eliminated, for example, according to the Chemical Mechanical Polishing (CMP).

Figure 8:
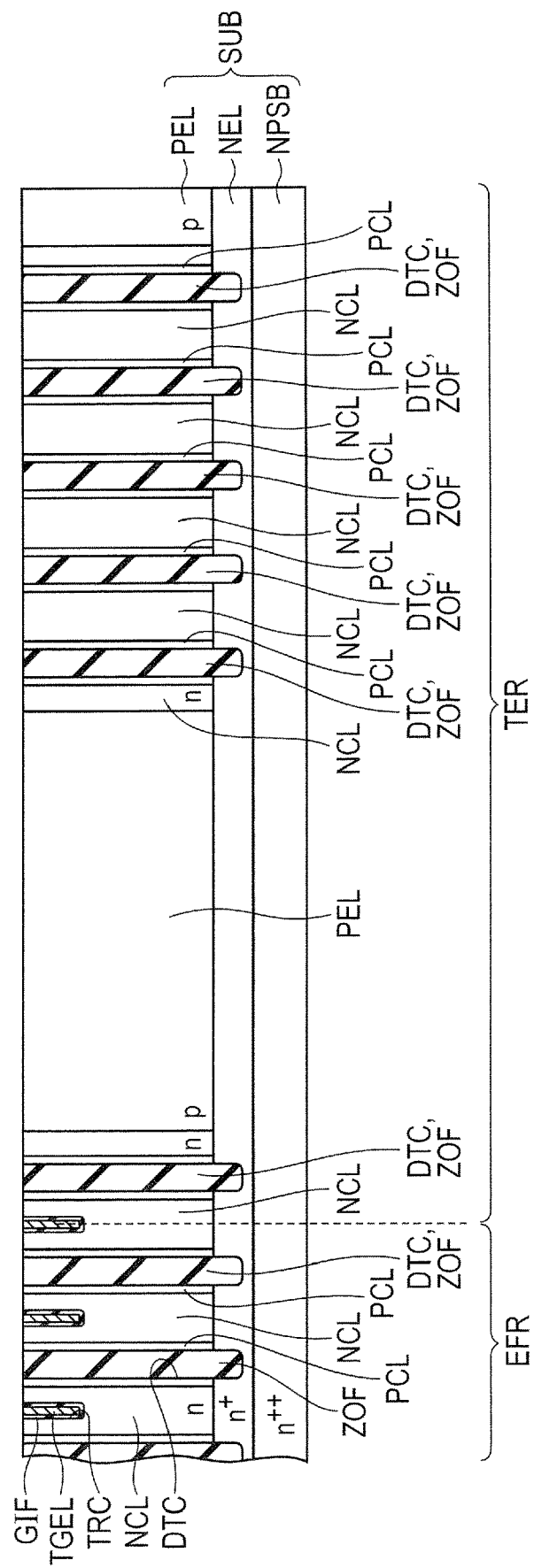
FIG. 8 is a cross-sectional view showing the process performed after the process shown in FIG. 7, according to the embodiment.

According to this, as shown in FIG. 8, the buried insulators ZOF (second buried insulators) are formed in the element region EFR, and the buried insulators ZOF (first buried insulators) are formed in the terminal region TER. The buried insulators ZOF formed in the terminal region TER are formed in island shapes in a planar view (refer to FIG. 3). The buried insulators ZOF formed in the element region EFR are also formed in island shapes in a planar view (refer to FIG. 3).

Figure 9:
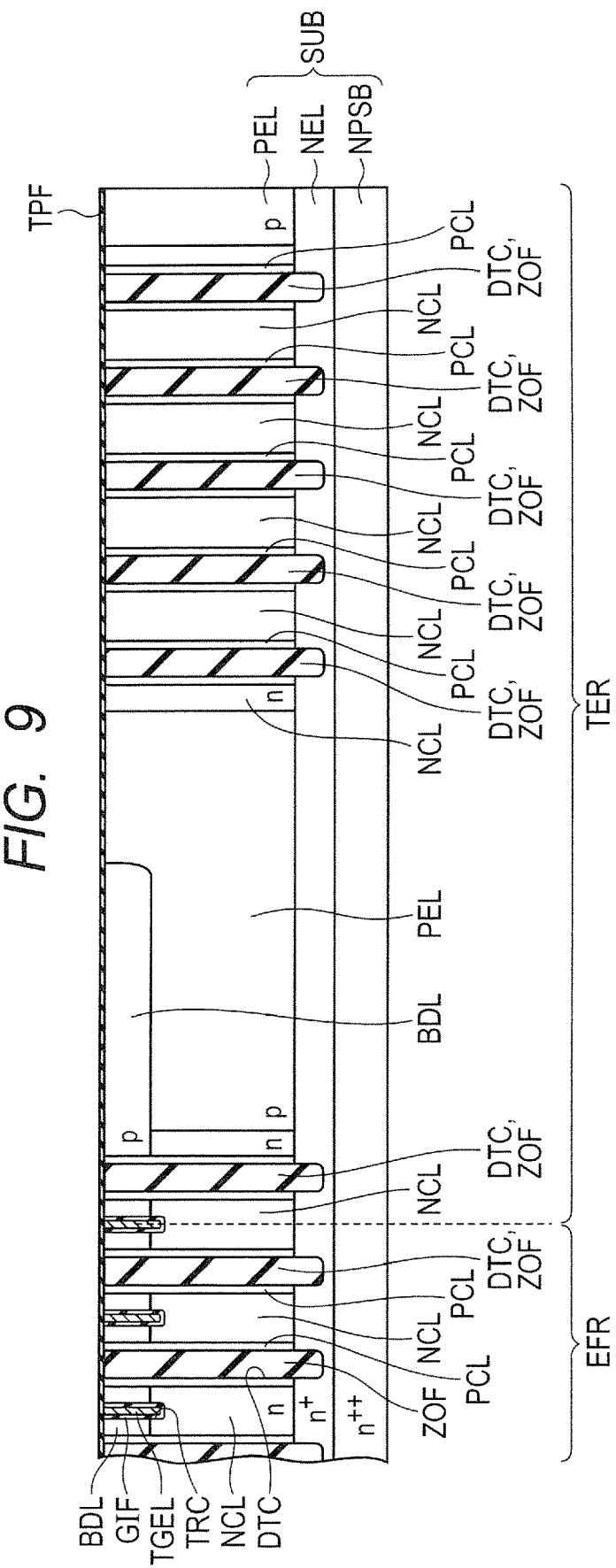
FIG. 9 is a cross-sectional view showing the process performed after the process shown in FIG. 8, according to the embodiment.

The thermal oxidation processing oxidizes the surface of the semiconductor substrate SUB, to form the protective insulating film TPF (refer to FIG. 9). During this thermal processing, the silicon oxide film positioned within the deep trench DTC shrinks. The predetermined photoengraving processing forms the photoresist pattern (not illustrated) for baring the region where the base diffusion layer is formed. With the photoresist pattern as the injection mask, the p-type dopant is injected through the protective insulating film TPF. Thereafter, the photoresist pattern is eliminated. According to this, as shown in FIG. 9, the p-type base diffusion layer BDL is formed. The base diffusion layer BDL is formed from the surface of the semiconductor substrate SUB at a position shallower than the bottom of the gate trench TRC.

Figure 10:
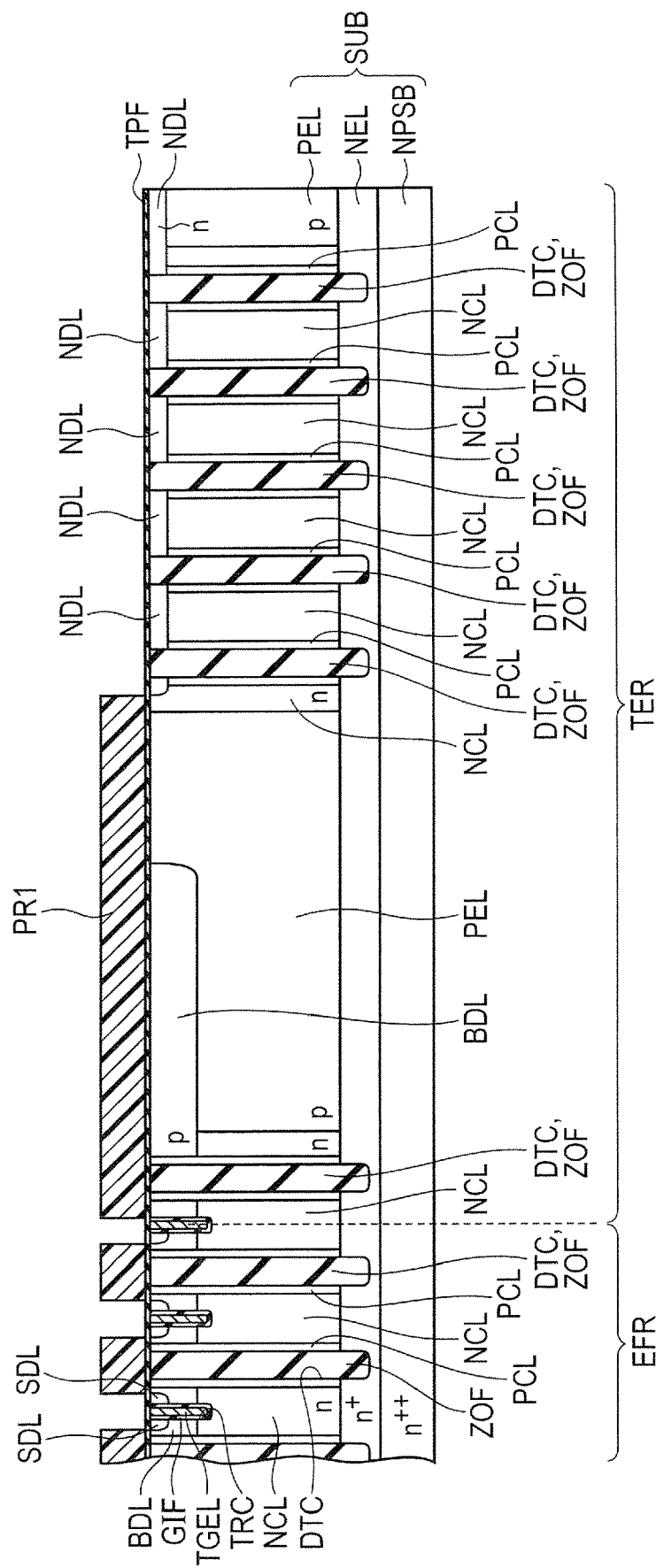
FIG. 10 is a cross-sectional view showing the process performed after the process shown in FIG. 9, according to the embodiment.

As shown in FIG. 10, the predetermined photoengraving processing is performed to bare the terminal region TER as well as to form the photoresist pattern PR1 for baring the regions where the source diffusion layers are formed in the element region EFR. With the photoresist pattern PR1 as the injection mask, the n-type dopant is injected through the protective insulating film TPF.

According to this, the source diffusion layers SDL are formed in the element region EFR. The source diffusion layer SDL is formed from the surface of the base diffusion layer BDL at a position shallower than the bottom of the base diffusion layer BDL. The n-type diffusion layers NDL are formed in the terminal region TER. Thereafter, the photoresist pattern PR1 is eliminated.

Figure 11:
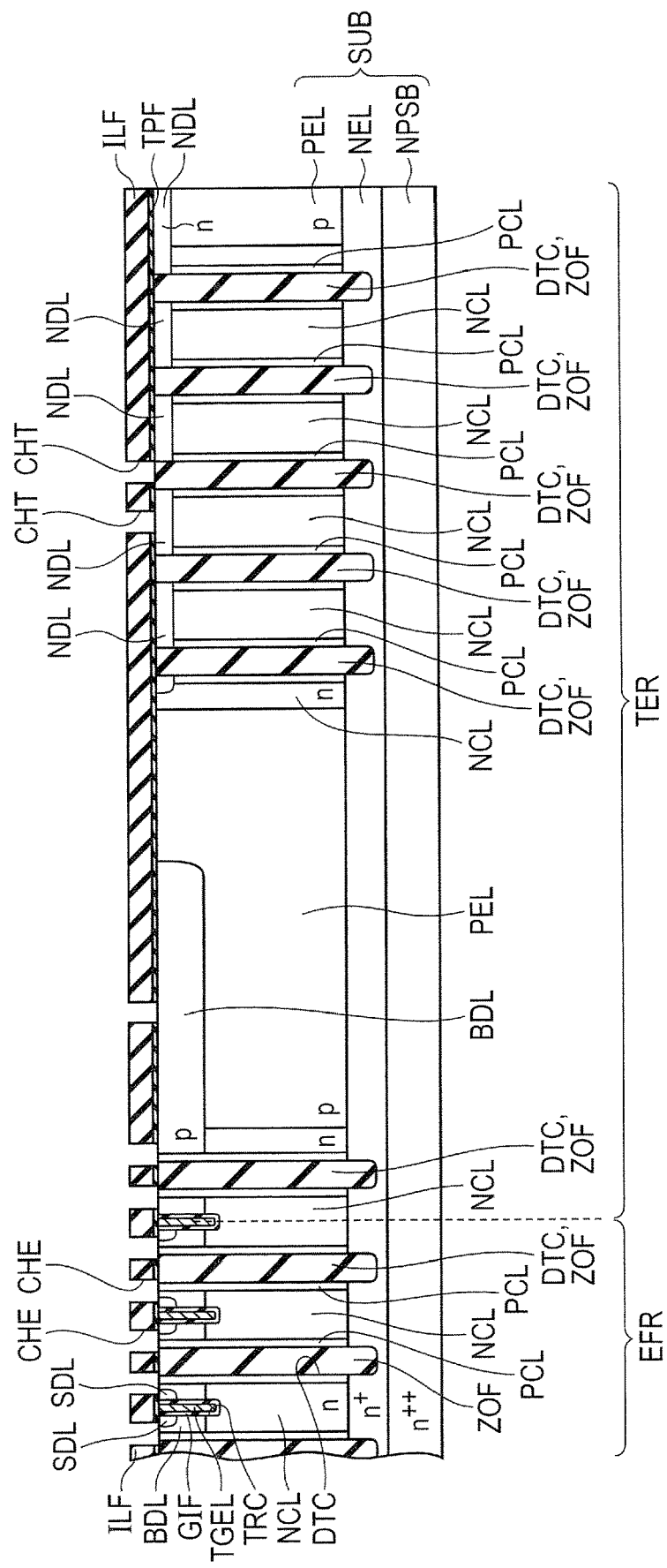
FIG. 11 is a cross-sectional view showing the process performed after the process shown in FIG. 10, according to the embodiment.

An insulating film (not illustrated) as the interlayer insulating film is formed to cover the semiconductor substrate SUB (protective insulating film TPF). The insulating film is subjected to the predetermined photoengraving and etching processing, hence to form each opening portion CHE for baring the source diffusion layer SDL and the base diffusion layer BDL in the element region EFR as shown in FIG. 11. In the terminal region TER, each opening portion CHE for baring the n-type diffusion layer NDL is formed.

Figure 12:
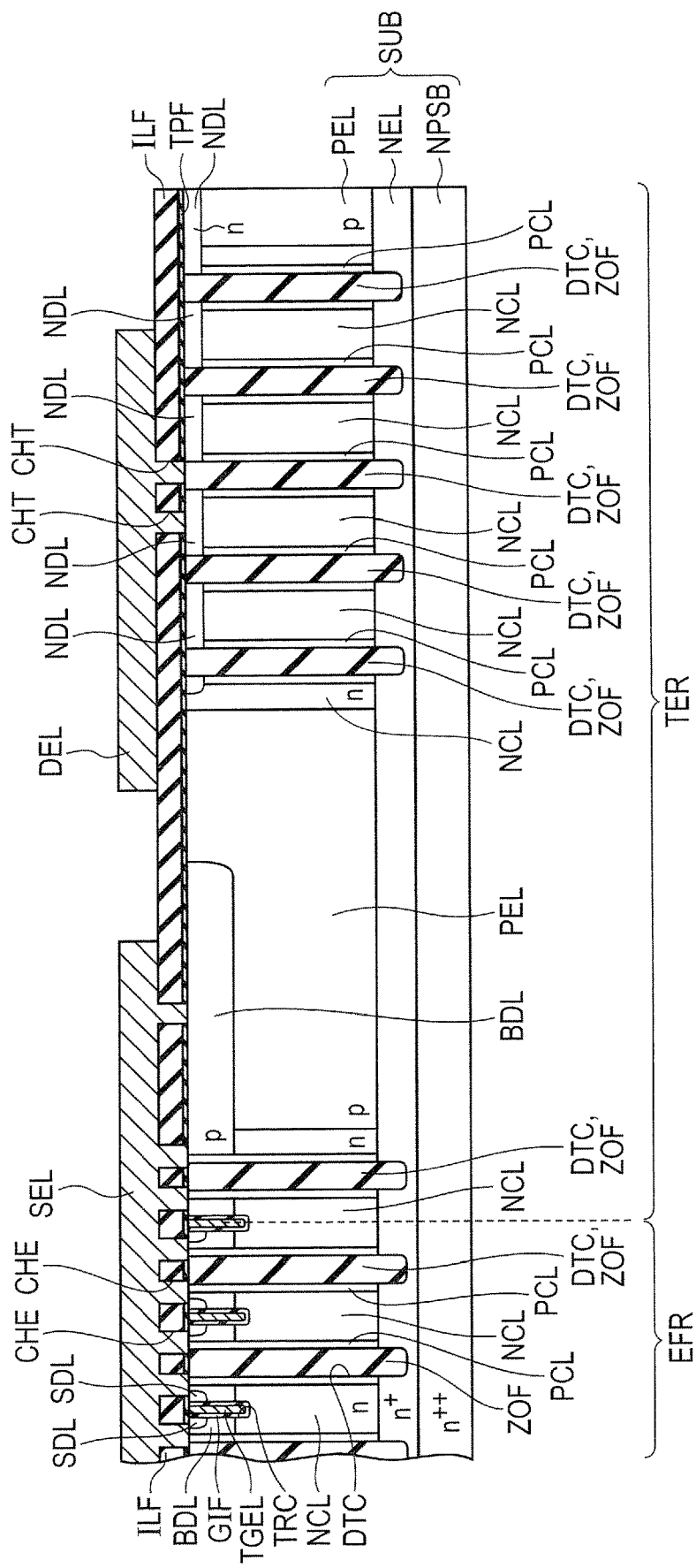
FIG. 12 is a cross-sectional view showing the process performed after the process shown in FIG. 11, according to the embodiment.

An aluminum film (not illustrated) is formed to cover the interlayer insulating film ILF, for example, according to the sputtering. The aluminum film is subjected to the predetermined photoengraving and etching processing, hence to form the source electrode SEL in the element region EFR as shown in FIG. 12. In the terminal region TER, the drain electrode DEL is formed.

The source electrode SEL is electrically coupled to the source diffusion layer SDL and the base diffusion layer BDL through the aluminum film portion embedded in the opening portion CHE. The drain electrode DEL is electrically coupled to the n-type diffusion layer NDL through the aluminum film portion embedded in the opening portion CHT.

Figure 13:
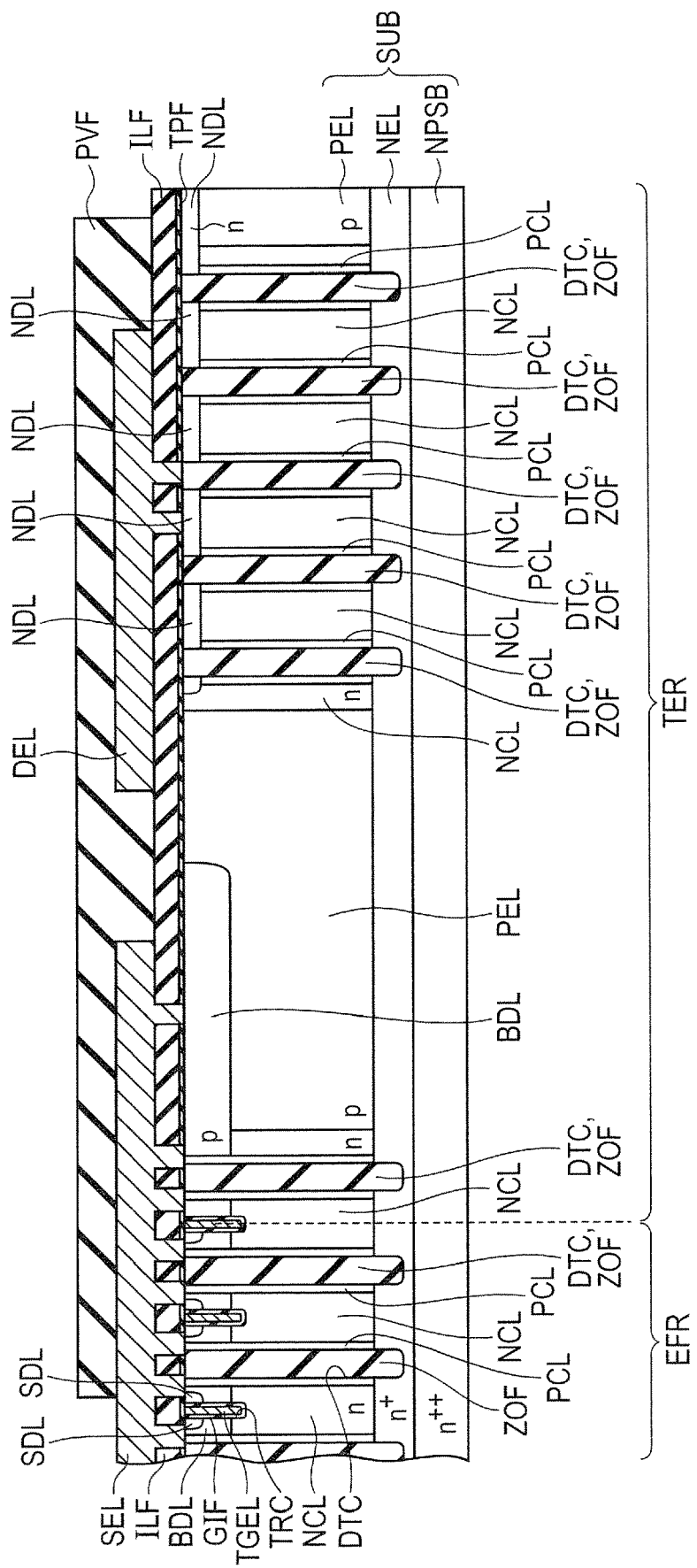
FIG. 13 is a cross-sectional view showing the process performed after the process shown in FIG. 12, according to the embodiment.

The insulating film (not illustrated) as the passivation film is formed to cover the source electrode SEL and the drain electrode DEL. The insulating film is subjected to the predetermined photoengraving and etching processing, hence to form the passivation film PVF which covers the predetermined region in the element region EFR and the terminal region TER, as shown in FIG. 13. Then, the scribe region is diced, to take out a plurality of semiconductor devices as chips. Thus, the main portion of the semiconductor device PSD is completed.

The above-mentioned semiconductor device PSD can suppress the warp of the semiconductor substrate by positioning the buried insulators ZOF formed in the terminal region TER in island shapes. This will be described in comparison with a semiconductor device according to a comparison example.

Figure 14:
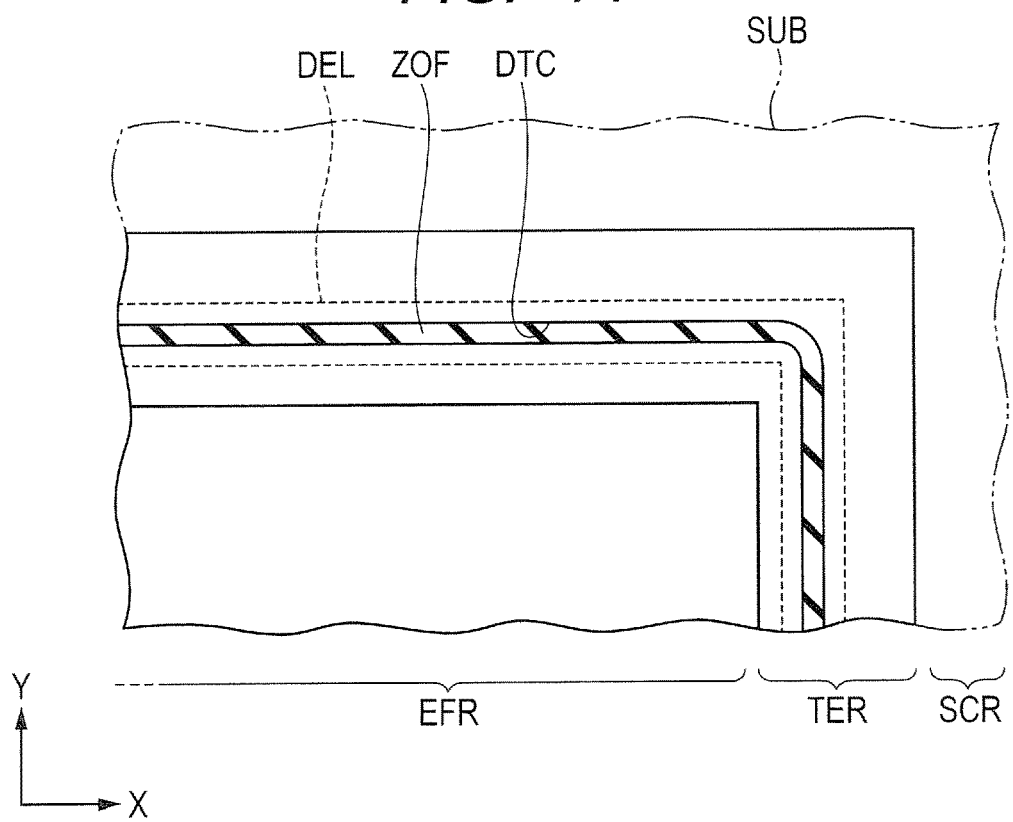
FIG. 14 is a partially enlarged top plan view of a semiconductor device according to a comparison example.

As shown in FIG. 14, in the semiconductor device according to the comparison example, the terminal region TER is arranged to surround the element region EFR. In the terminal region TER, the buried insulator ZOF is formed within the deep trench DTC formed in a ring shape in a way of surrounding the element region EFR seamlessly. The, drain electrode DEL is formed to cover the buried insulator ZOF.

In the process of forming a semiconductor element such as MOSFET in the element region EFR, a protective insulating film is previously formed when injecting the dopant. The protective insulating film is formed according to the thermal processing. The thermal processing is occasionally performed in the process later than the process of forming the silicon oxide film within the deep trench DTC. During the thermal processing, the silicon oxide film formed within the deep trench DTC shrinks.

The deep trench DTC filled with the silicon oxide film is deeper than the trench for isolation, and the deep trench DTC is formed in a ring shape to surround the element region EFR. Therefore, when the silicon oxide film shrinks according to the thermal processing, the semiconductor substrate (wafer) is easily warped downwardly.

When the semiconductor substrate being warped is carried to the next step, there is a fear of causing a carrying error within the semiconductor manufacturing device. Further, the semiconductor substrate may fail to be surely adsorbed to the stage.

The deep trench DTC of the semiconductor device according to the comparison example has linearly extending portions including extending portion along the X-axis and extending portion along the Y-axis. Therefore, when forming the p-type column layer through the deep trench DTC by the oblique injection of the p-type dopant, there is a fear of failing to assuredly form the p-type column layer along the side wall of the deep trench DTC. For example, when obliquely injecting the above along the X-axis, the p-type dopant is hardly injected to the side wall portion of the deep trench DTC extending in the X-axis direction, which disturbs the formation of the p-type column layer there. This may cause a shortage of the withstand voltage in the terminal region TER.

Contrary to the comparison example, in the above-mentioned semiconductor device PSD, the deep trenches DTC are formed in island shapes at a distance from each other and the silicon oxide films are formed within the deep trenches DTC. According to this, even when the silicon oxide films shrink in the later thermal processing, a warp of the semiconductor substrate can be diminished compared with the case of the shrink of the silicon oxide film within the deep trench formed in a ring shape. As the result, in the semiconductor manufacturing device in the later process, disadvantage such as a carrying error can be suppressed.

By forming the deep trenches DTC in island shapes, the p-type column layer PCL can be surely formed along the side wall surface of the deep trench DTC, compared with the deep trench having the portion extending along the X-axis and the Y-axis. As the result, the withstand voltage of the terminal region TER can be assured.

Further, by surely forming the p-type column layer PCL along the side wall of the deep trench DTC, the leak current can be suppressed more than in the case of having the portion failing in forming the p-type column layer.

Further, compared with the deep trench having the linearly extending portion, the silicon oxide film can be filled surely in the deep trench DTC which is formed in an island shape. According to this, it is not necessary to provide any additional process of forming the silicon oxide film in the portion of the deep trench DTC where the silicon oxide film is not formed enough.

By improving the filling efficiency of the silicon oxide film within the deep trench DTC, the width of the terminal region TER can be secured relatively wide. According to this, the withstand voltage of the terminal region TER can be improved.

Further, when chipping occurs in dicing the scribe region SRB of the semiconductor substrate SUB (refer to FIG. 3), the buried insulators ZOF arranged in island shapes can prevent the chipping. According to this, chipping can be prevented from spreading to the element region EFR.

The above-mentioned manufacturing method of the semiconductor device can achieve the structure of electrically coupling the drain electrode DEL positioned on one surface of the semiconductor substrate SUB to the $n^{++}$-type substrate NPSB positioned on the other surface of the semiconductor substrate SUB, together with the process of forming the n-type column layer NCL through the deep trenches DTC formed in the element region EFR. In other words, the drain electrode DEL and the $n^{++}$-type substrate NPSB can be electrically coupled together by the n-type column layer NCL which is formed by injecting the n-type dopant through the deep trenches DTC formed in the element region EFR as well as in the terminal region TER.

Figure 15:
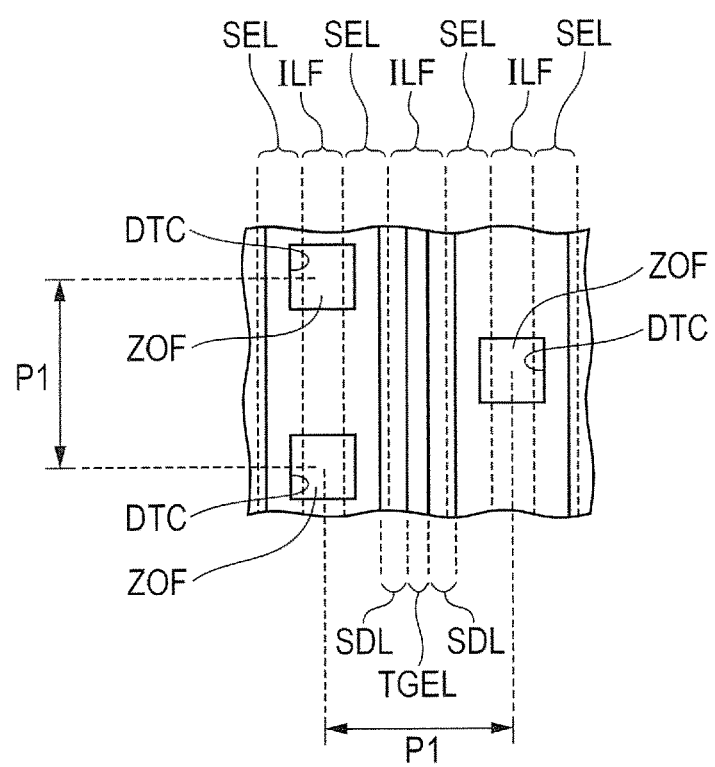
FIG. 15 is a partially top plan view showing another example of an arrangement pattern of buried insulators formed in an element region, according to the embodiment.
Figure 16:
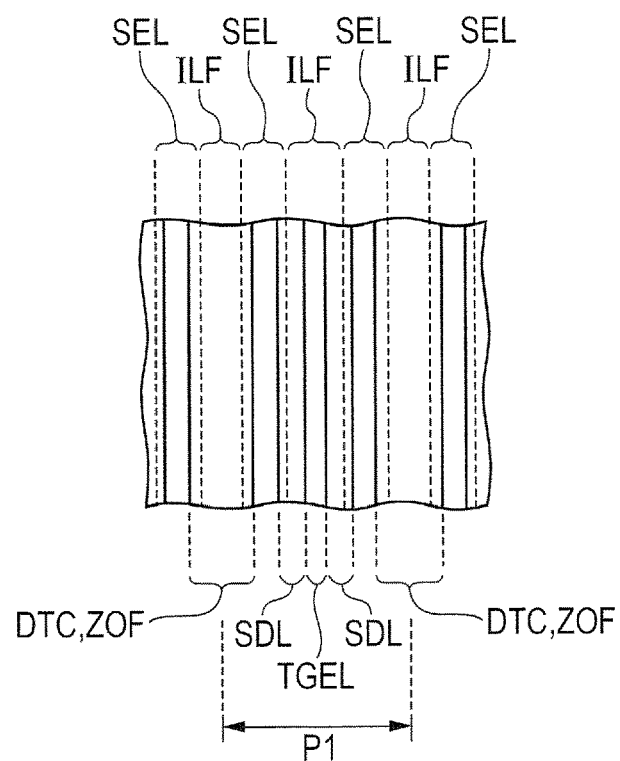
FIG. 16 is a partially top plan view showing further another example of the arrangement pattern of the buried insulators formed in the element region, according to the embodiment.

The above-mentioned semiconductor device has been described by taking the mesh-shaped gate electrode and the island-shaped buried insulator ZOF, for example, as the plane pattern of the buried insulator ZOF and MOSFET gate electrode TGEL formed in the element region. Additionally, as shown in FIG. 15, the buried insulator ZOF may be formed in an island-shaped plane pattern and the gate electrode TGEL may be formed in a stripe-shaped plane pattern. Further, as shown in FIG. 16, for example, the buried insulator ZOF may be formed in a stripe-shaped plane pattern and also the gate electrode TGEL may be formed in a stripe-shaped plane pattern.

Second Embodiment

A second example of a semiconductor device having the buried insulators (deep trenches) formed in island shapes in the terminal region will be described.

Figure 17:
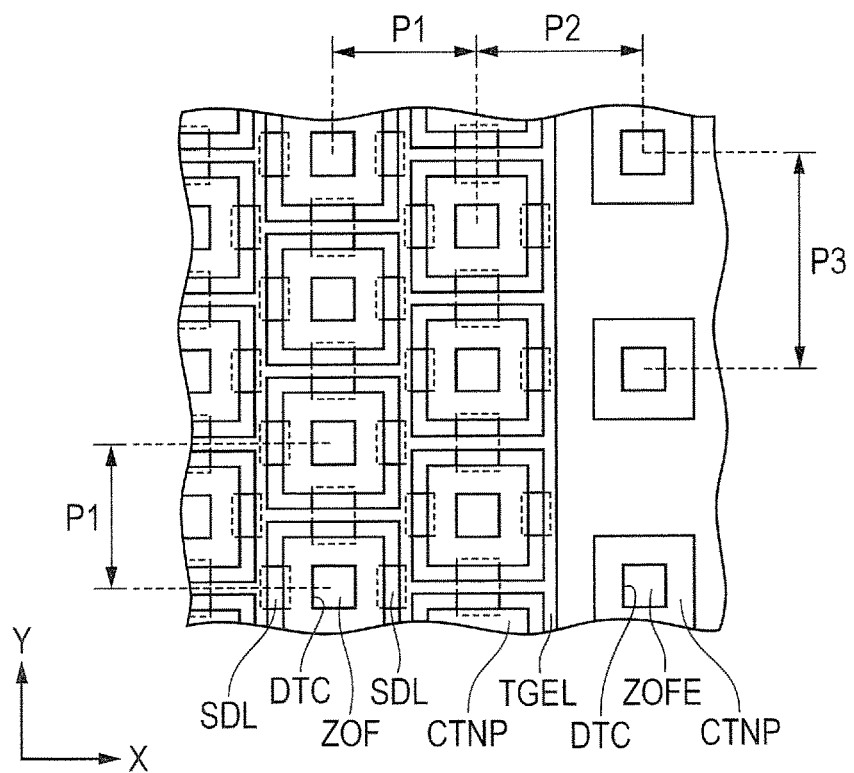
FIG. 17 is a partially enlarged top plan view showing one example of a plane pattern of a semiconductor device according to a second embodiment.
Figure 18:
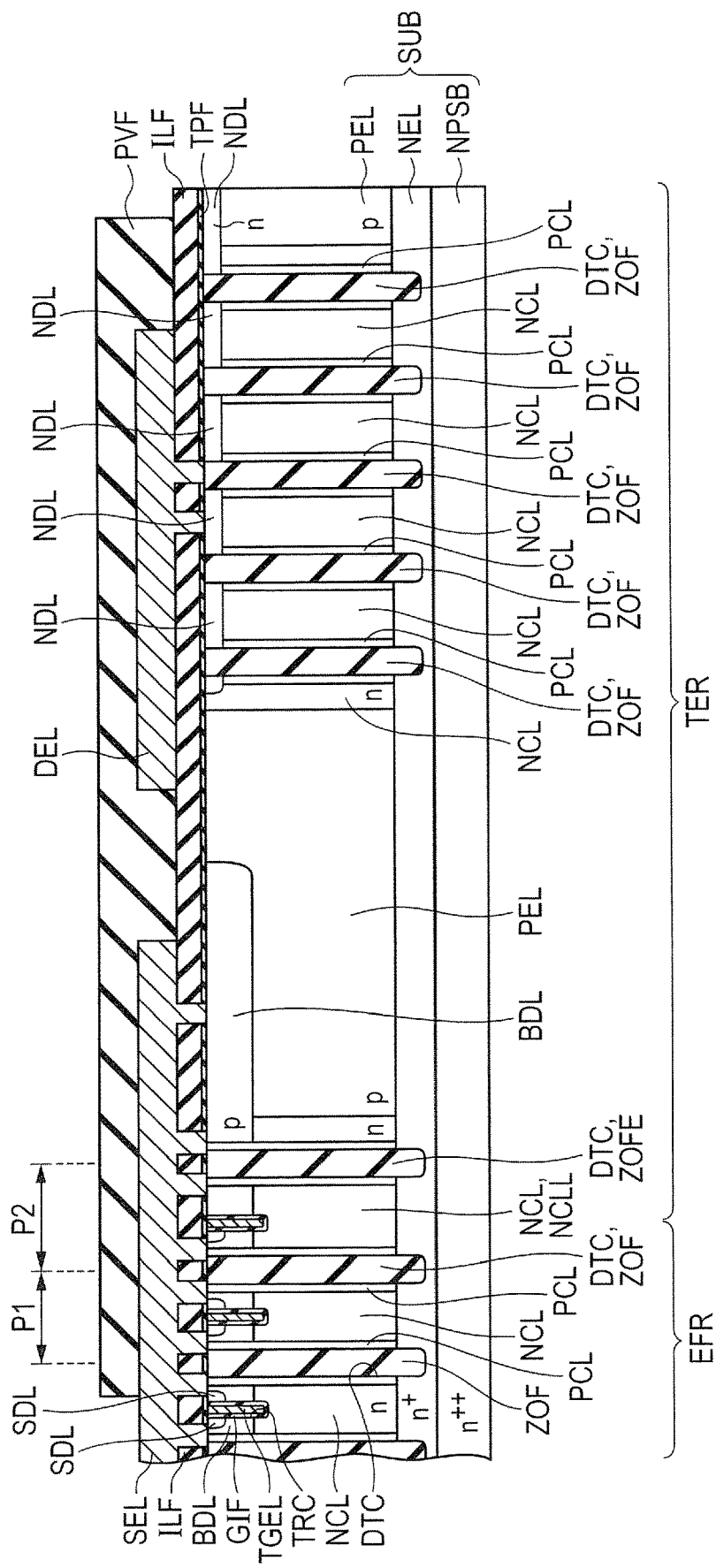
FIG. 18 is a cross-sectional view of the semiconductor device according to the embodiment.

As shown in FIGS. 17 and 18, the pitch related to the buried insulators ZOFE nearest to the element region EFR, of the buried insulators ZOF arranged in the terminal region TER is set wider than the pitch of the buried insulators ZOF arranged in the element region EFR, in the semiconductor device PSD.

The pitch of the buried insulators ZOF arranged in the element region is set at pitch P1. The pitch of the buried insulators ZOFE in the Y-axis is set at pitch P3. The pitch of the buried insulators ZOFE and the buried insulators ZOF in the element region EFR is set at pitch P2. The pitch P2 and the pitch P3 are set longer than the pitch P1. The other structure than this is the same as the structure of the semiconductor device shown in FIGS. 3 and 4; therefore, the same reference numerals are attached to the same components and their description will not be repeated unless necessity arises.

The above-mentioned semiconductor device PSD can be manufactured in the substantially same process as the process shown in FIGS. 5 to 13 as mentioned above, just by changing the mask pattern in forming the deep trench DTC.

In the above-mentioned semiconductor device PSD, the pitch P2 and the pitch P3 about the buried insulators ZOFE are set wider than the pitch P1 of the buried insulators ZOF arranged in the element region EFR. The n-type column layer NCLLs (NCL) are formed in the semiconductor substrate SUB by injecting the n-type dopant through the deep trenches DTC where the buried insulators ZOF and ZOFE are formed.

Here, in the semiconductor device (semiconductor device A) shown in FIGS. 17 and 18, the dopant concentration of the n-type column layer NCLL formed through the deep trench DTC where the buried insulator ZOFE is arranged is defined as dopant concentration A.

Figure 19:
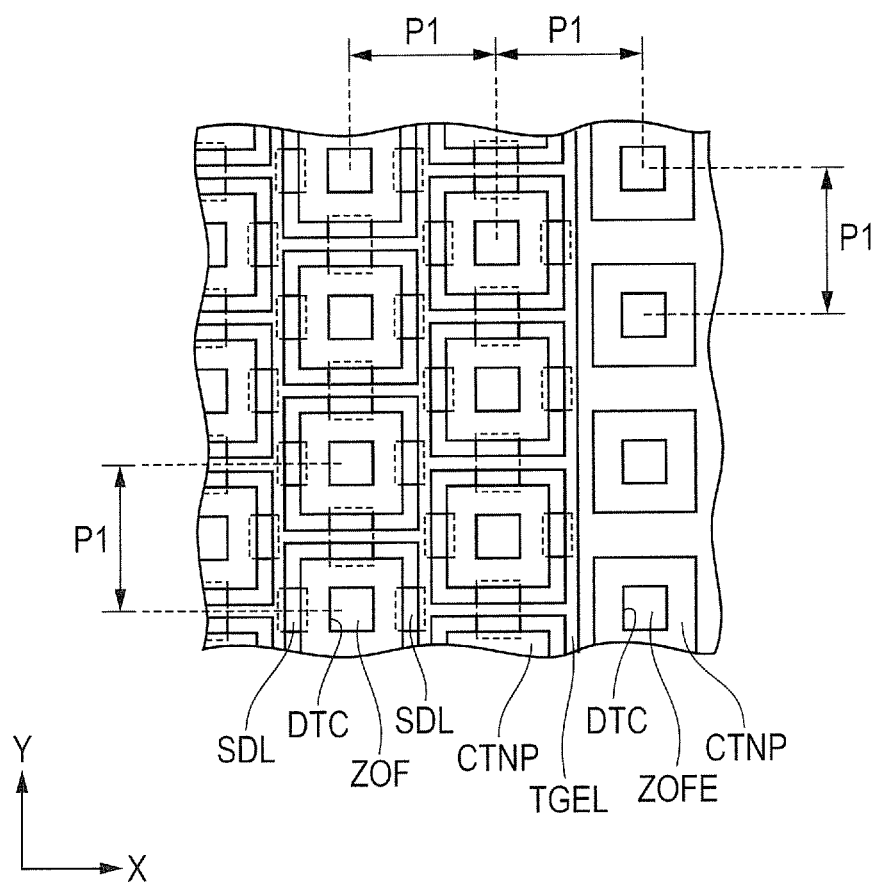
FIG. 19 is a partial top plan view showing the plane pattern of a semiconductor device to be compared, according to the embodiment.

On the other hand, as shown in FIG. 19, the dopant concentration of the n-type column layer NCL formed through deep trench DTC where the buried insulator ZOFE is arranged is defined as dopant concentration B, in the semiconductor device (semiconductor device B) where the pitch P1 of the buried insulators ZOFE is equal to the pitch P1 of the buried insulators ZOF arranged in the element region EFR.

In the semiconductor device A, the pitch of the buried insulators ZOFE arranged in the deep trench DTC is set larger than the pitch P1. Therefore, as for the dopant concentration A and the dopant concentration B respectively defined as the dopant number per unit volume, the dopant concentration A is lower than the dopant concentration B.

Figure 20:
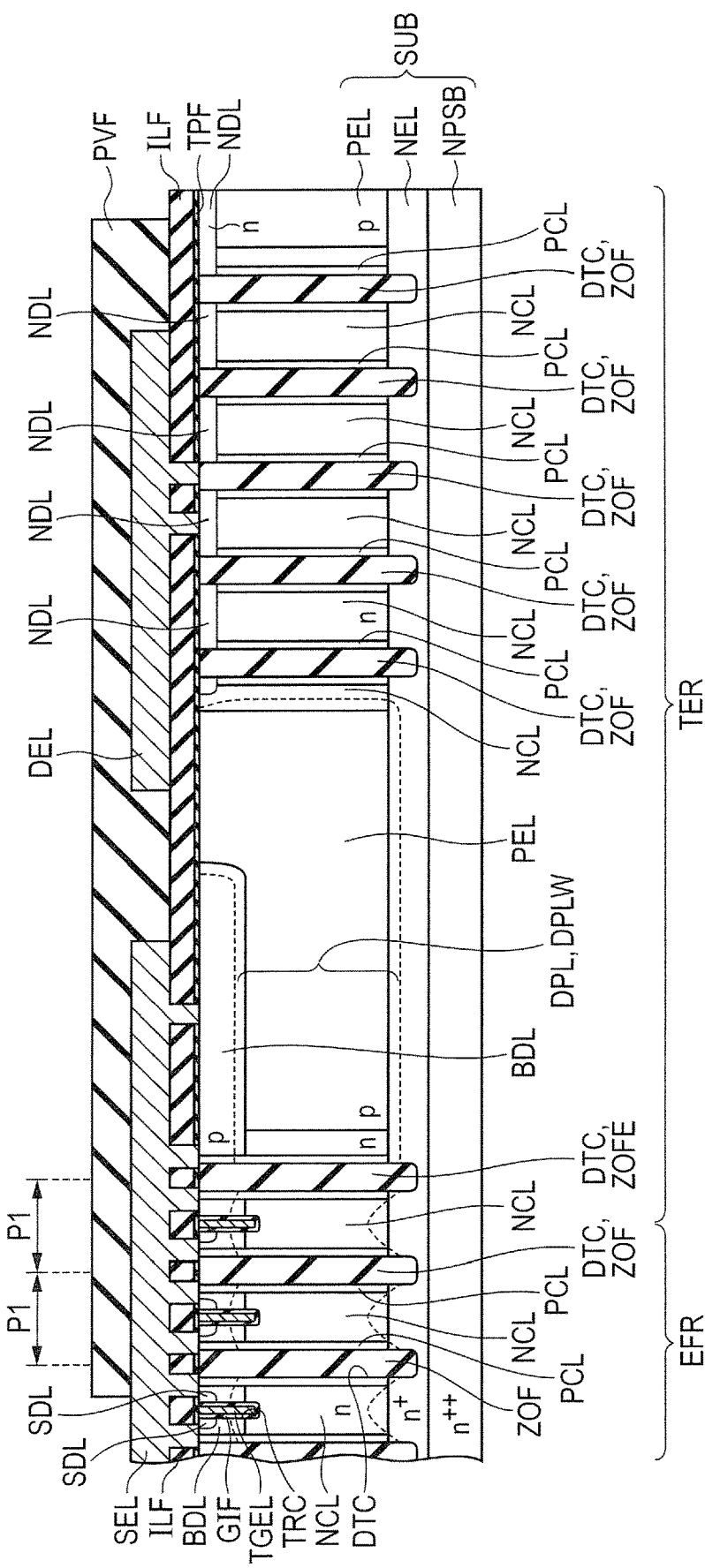
FIG. 20 is a cross-sectional view including a depletion layer of the semiconductor device to be compared, according to the embodiment.
Figure 21:
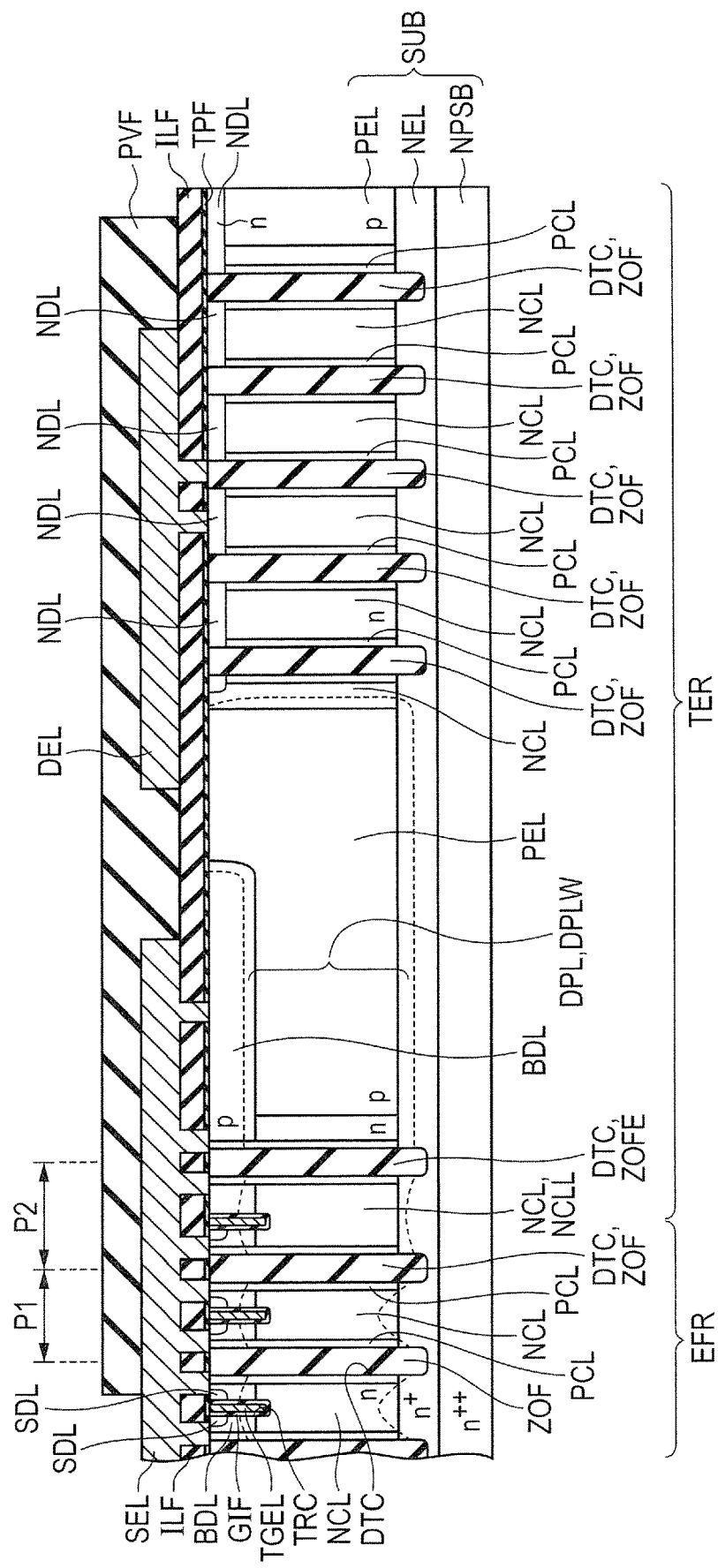
FIG. 21 is a cross-sectional view including the depletion layer of the semiconductor device according to the embodiment.

By comparison of the depletion layer at the off time between the semiconductor device A and the semiconductor device B, the depletion layer width DPLW of the depletion layer DPL formed in the n-type column layer NCLL in the semiconductor device A, as shown in FIG. 21, is wider than that formed in the n-type column layer NCL in the semiconductor device B, as shown in FIG. 20. As the result, the withstand voltage of the terminal region TER can be further improved.

Figure 22:
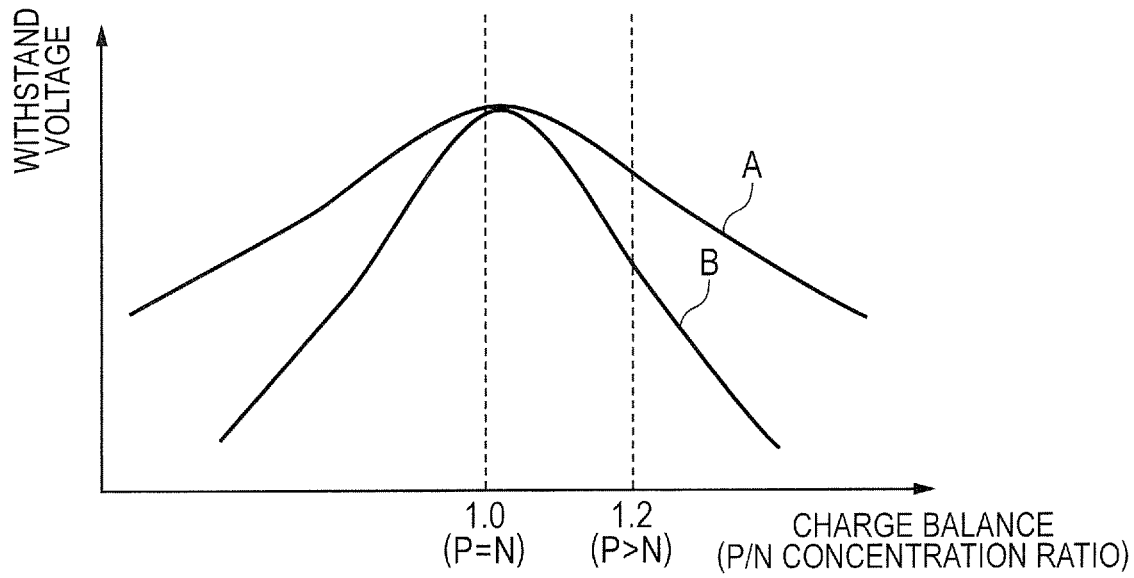
FIG. 22 is a graph showing a relation between charge balance and withstand voltage, according to the embodiment.

As shown in FIG. 22, the n-type dopant or the p-type dopant is injected in a way of deviating the ratio (charge balance) of the p-type dopant concentration and the n-type dopant concentration in the region having the buried insulator ZOFE and the charge balance in the element region EFR from the charge balance that becomes the peak of the withstand voltage.

In the semiconductor device having the super junction structure, when the above charge balances are matched with the charge balance that becomes the peak withstand voltage, it is known that the avalanche breakdown easily happens. The avalanche breakdown is a mode in which due to the flyback voltage occurring in a switching off operation in inductive load, the spike voltage exceeds the drain rated withstand voltage of the MOSFET into the breakdown region to destroy the balance.

In the above-mentioned semiconductor device, the above avalanche breakdown can be suppressed by deviating the charge balance in the region having the buried insulator ZOFE and the charge balance in the element region EFR from the charge balance that becomes the peak of the withstand voltage.

Figure 23:
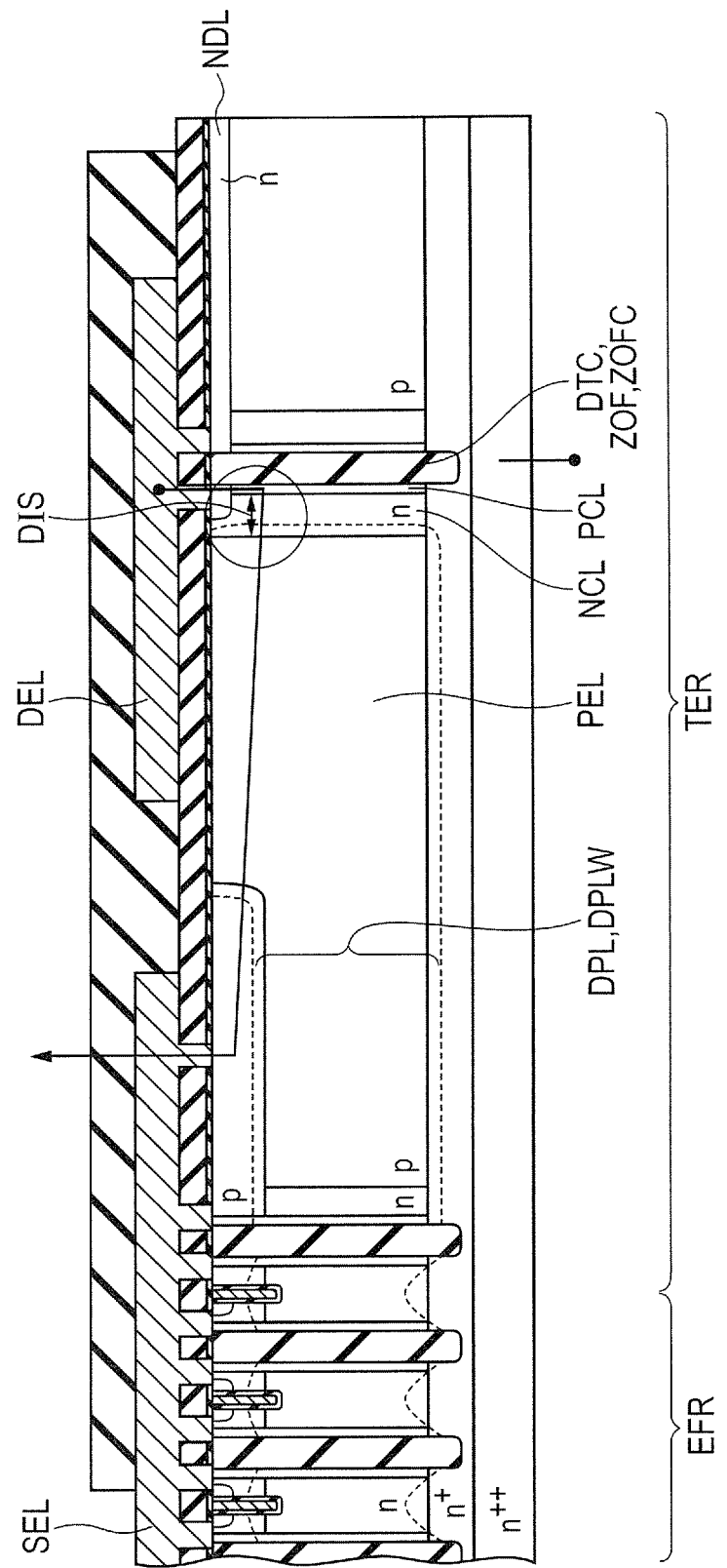
FIG. 23 is a cross-sectional view for use in describing the operation of one parasitic bipolar transistor in the terminal region, according to the embodiment.

As shown in FIG. 23, when the distance DIS between the p-type column layer PCL and the p-type epitaxial layer PEL gets shorter in the portion (refer to the inside of the circle frame) near the buried insulator ZOFC (third party of the buried insulator) positioned in the region where the drain electrode DEL is in contact with the n-type diffusion layer NDL, in the terminal region TER, a parasitic bipolar transistor is supposed to operate. In other words, at the off time, a PNP parasitic bipolar transistor including the p-type epitaxial layer PEL, the n-type column layer NCL, and the p-type column layer PCL operates and as shown by the arrow, current supposedly flows from the drain electrode DEL to the source electrode SEL.

Figure 24:
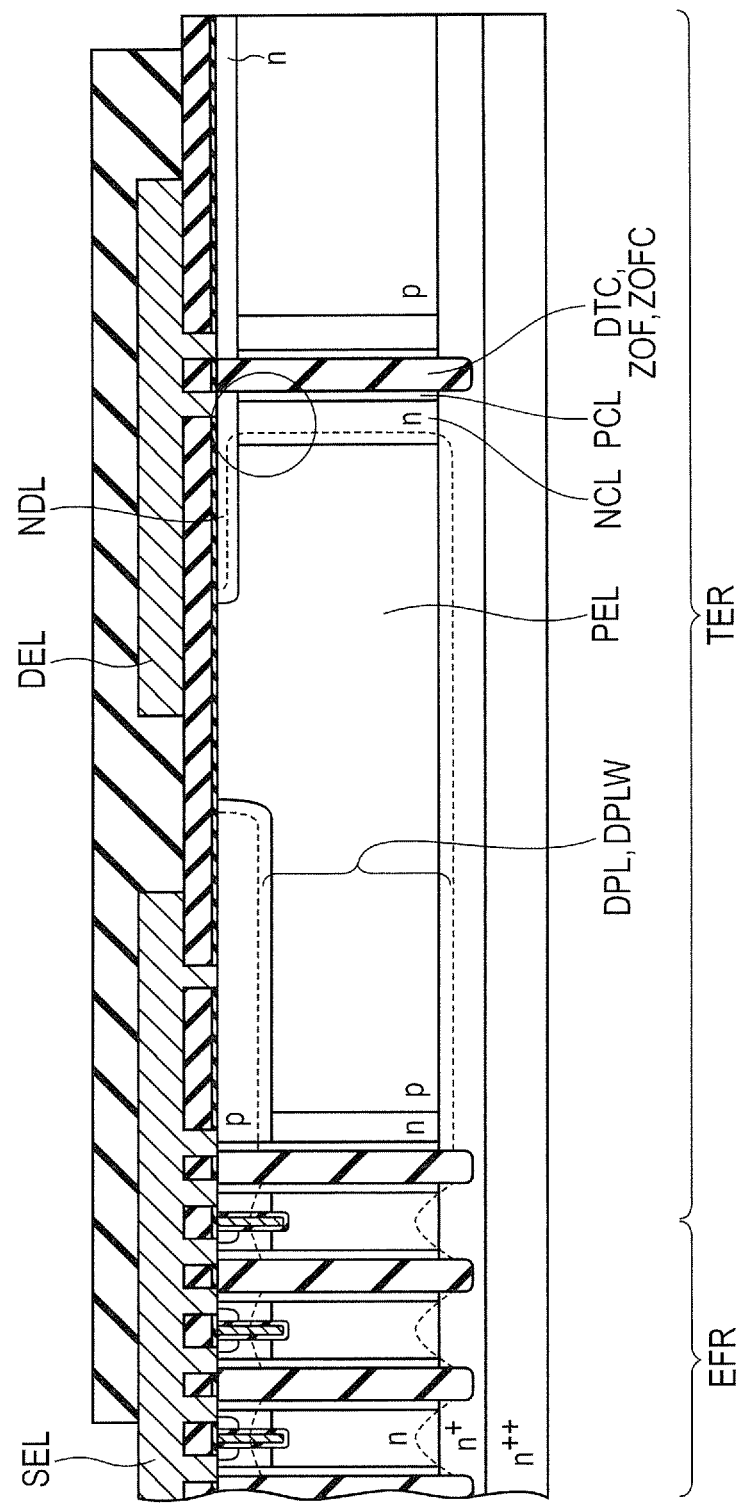
FIG. 24 is a cross-sectional view showing a first measure for suppressing the operation of one parasitic bipolar transistor, according to the embodiment.

To suppress the supposed operation of the PNP parasitic bipolar transistor, it is preferable to extend the n-type diffusion layer NDL from the buried insulator ZOFC toward the element region EFR, as shown in FIG. 24. By extending the n-type diffusion layer NDL toward the element region EFR, the depletion layer end of the depletion layer DPL is positioned along the extending n-type diffusion layer NDL at the off time. According to this, the electric field in the region near the buried insulator ZOFC is reduced, which can suppress the operation of the PNP parasitic bipolar transistor.

Figure 25:
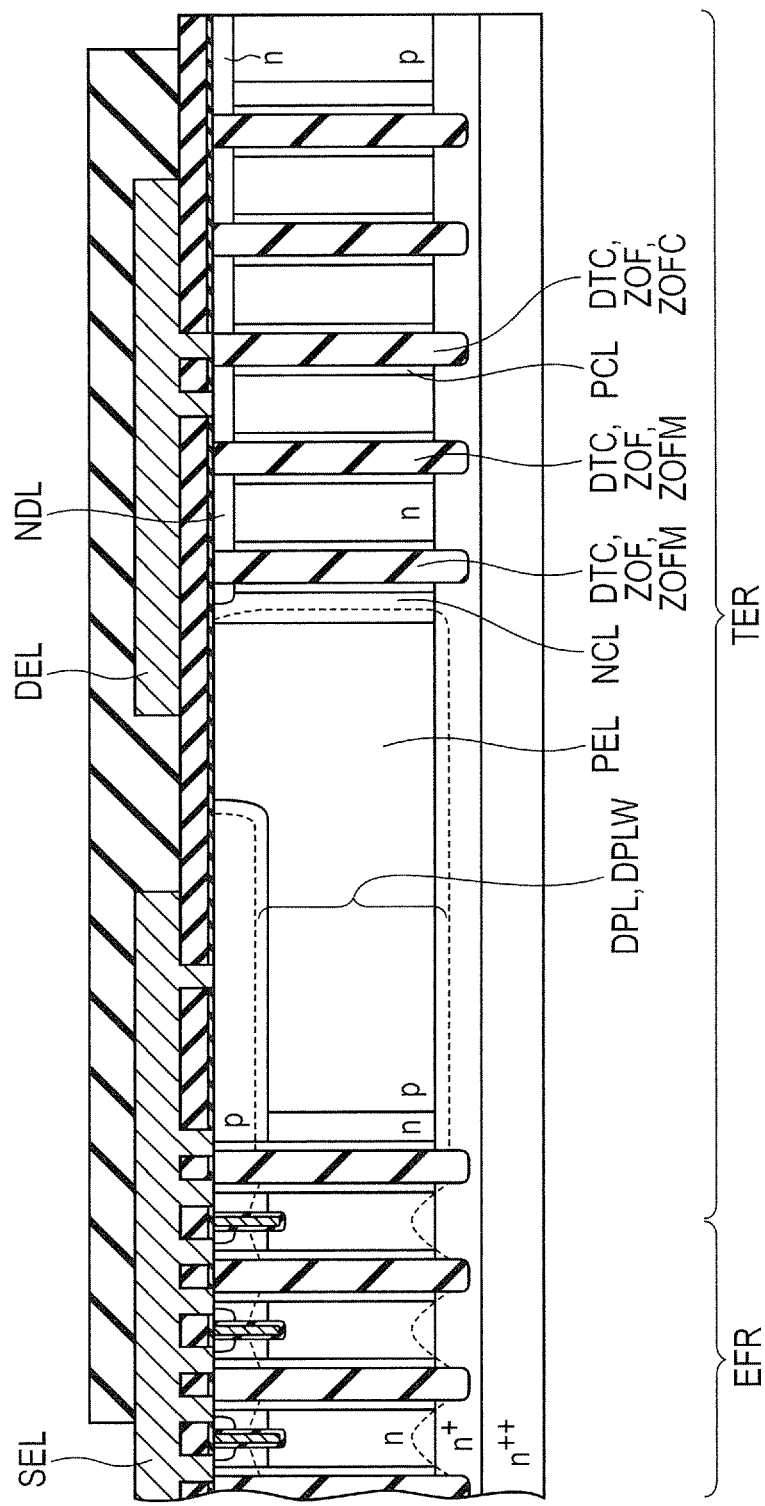
FIG. 25 is a cross-sectional view showing a second measure for suppressing the operation of one parasitic bipolar transistor, according to the embodiment.

As shown in FIG. 25, it is preferable to further arrange the buried insulators ZOFM (fourth party of the buried insulator) in the region between the buried insulators ZOFC and the p-type epitaxial layer PEL. By arranging the buried insulators ZOFM, the distance between the buried insulators ZOFC and the p-type epitaxial layer PEL can be longer, which can suppress the operation of the PNP parasitic bipolar transistor. The above mentioned two countermeasures are taken in the semiconductor devices described according to the first and the second embodiments.

Figure 26:
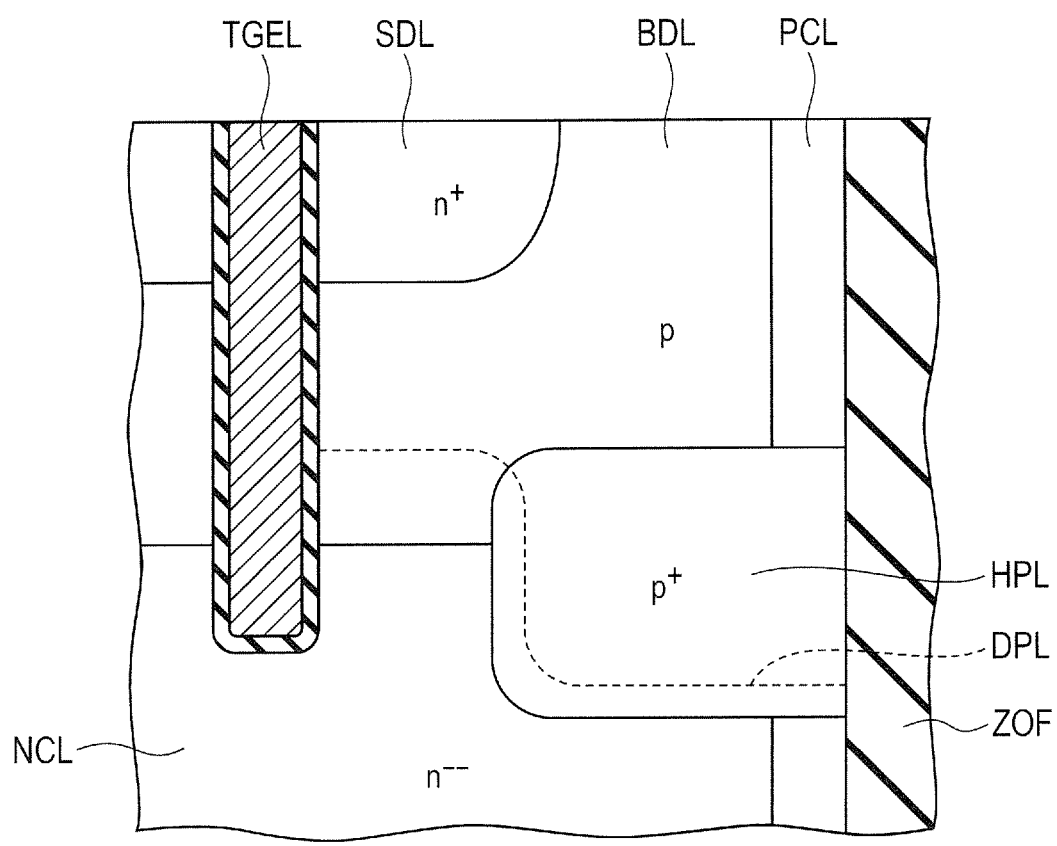
FIG. 26 is a partially enlarged cross-sectional view showing the structure of the element region for suppressing the operation of another parasitic bipolar transistor, according to the embodiment.

In the element region EFR where the MOSFET is formed, the parasitic NPN bipolar transistor including the n-type source diffusion layer SDL, the p-type base diffusion layer BDL, and the n-type column layer NCL operates at the off time and the avalanche breakdown is supposed to occur. Therefore, the countermeasure such as providing the p-type highly concentrated layer HPL (second highly concentrated layer) from the p-type column layer PCL toward the gate electrode TGEL is occasionally taken, as shown in FIG. 26, not to operate the bipolar transistor parasitic NPN.

Figure 27:
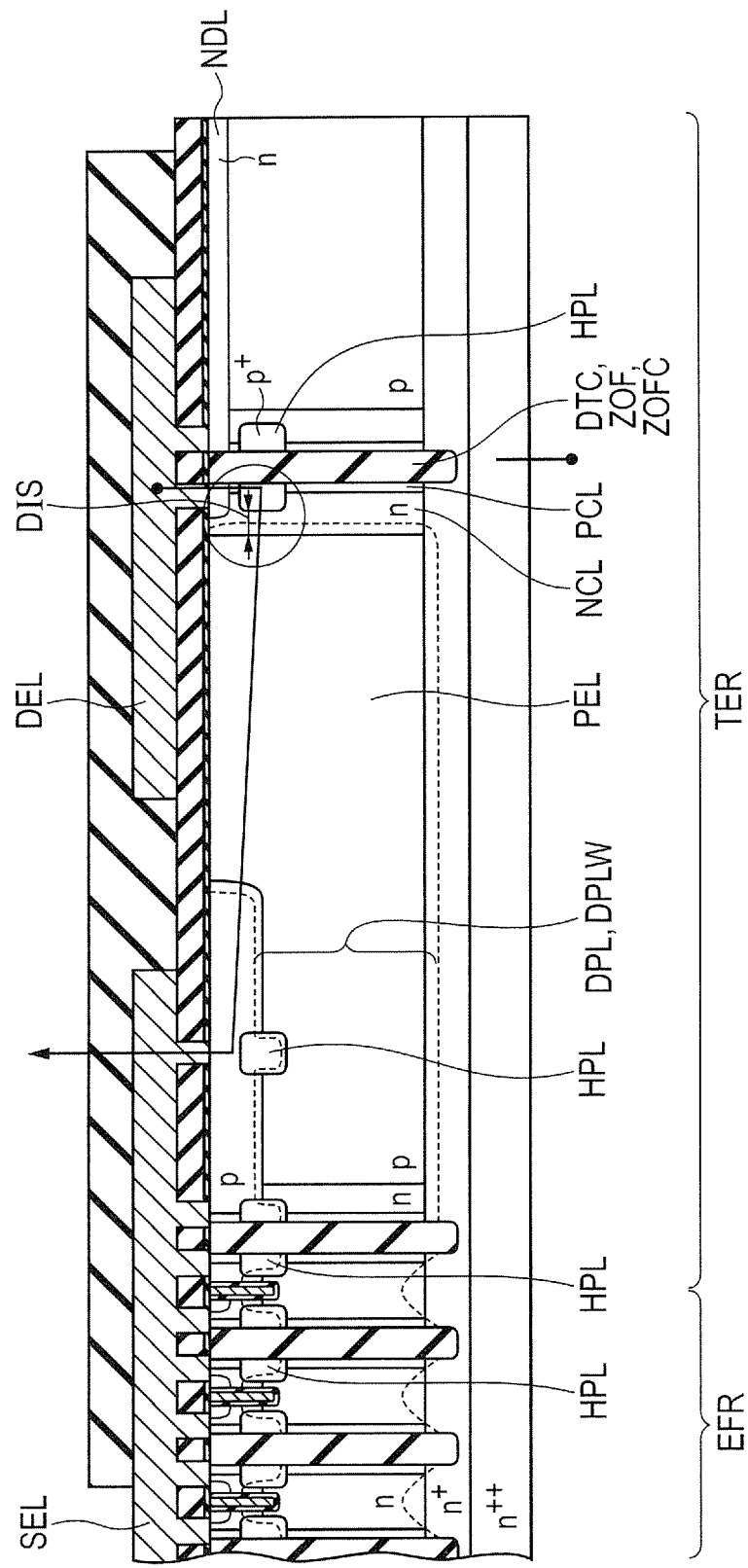
FIG. 27 is a cross-sectional view for use in describing the operation of one parasitic bipolar transistor in the terminal region, based on the structure for suppressing the operation of another parasitic bipolar transistor, according to the embodiment.

This p-type highly concentrated layer HPL is formed by injecting the p-type dopant, after forming the opening portions CHE and CHT in the interlayer insulating film ILF. Therefore, as shown in FIG. 27, the distance DIS between the p-type highly concentrated layer HPL (first highly concentrated layer) and the p-type epitaxial layer PEL is supposed to be further shorter in the terminal region TER (refer to the inside of the circle frame).

Figure 28:
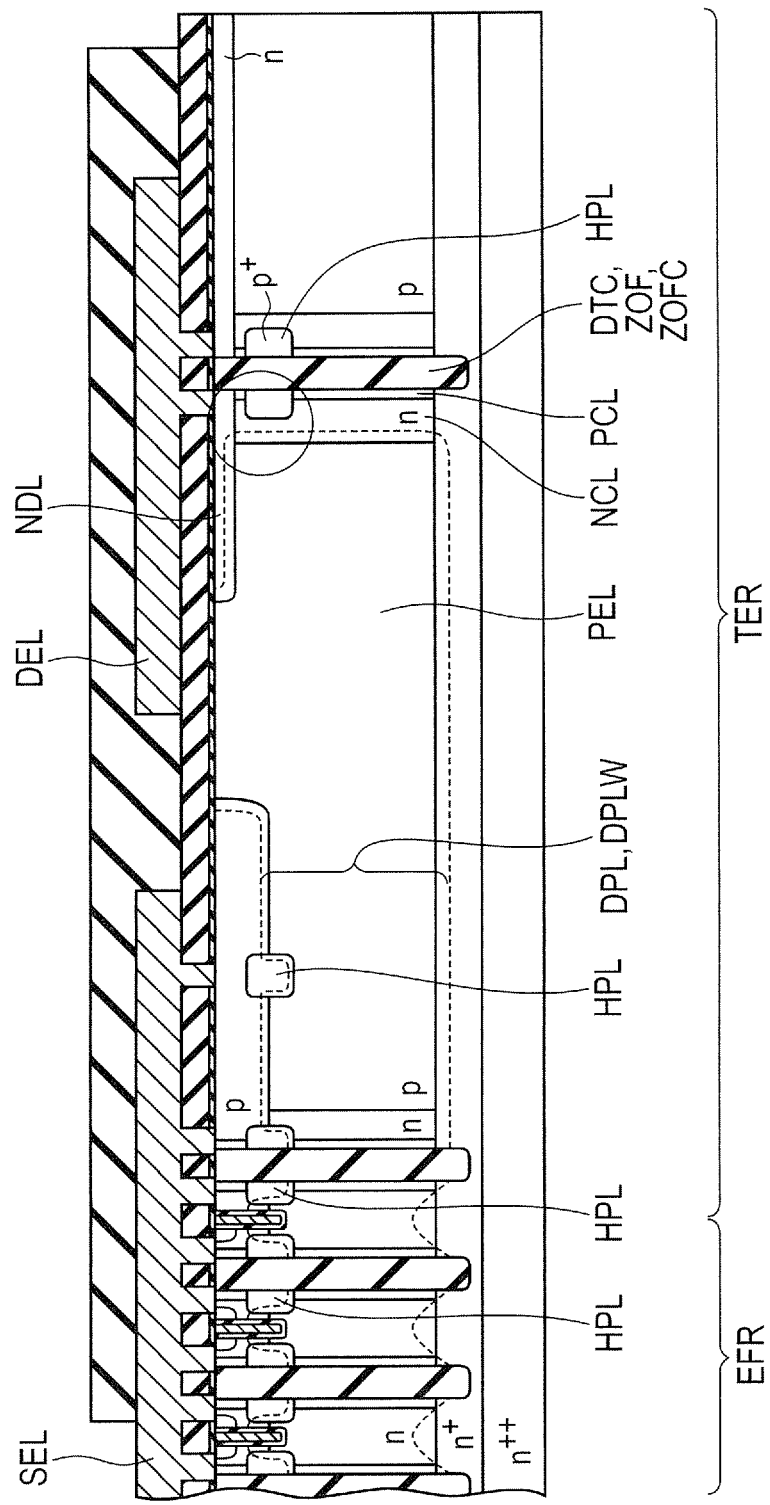
FIG. 28 is a cross-sectional view showing a first measure for suppressing the operation of one parasitic bipolar transistor, based on the structure of suppressing the operation of another parasitic bipolar transistor, according to the embodiment.

Similarly to the above-mentioned countermeasure, by extending the n-type diffusion layer NDL from the buried insulator ZOFC toward the element region EFR, as shown in FIG. 28, the electric field in the region near the buried insulator ZOFC is reduced, which can suppress the operation of the PNP parasitic bipolar transistor.

Figure 29:
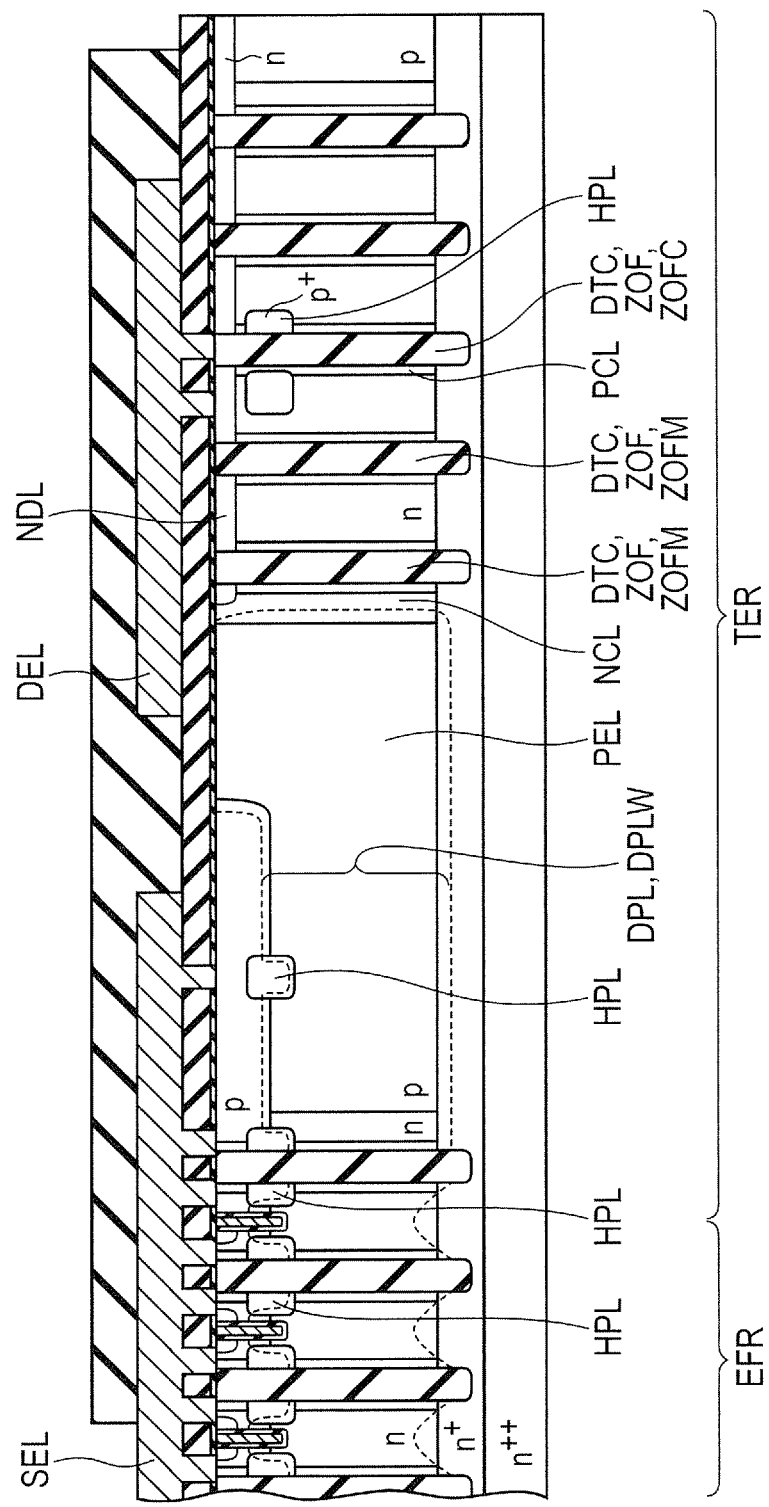
FIG. 29 is a cross-sectional view showing a second measure for suppressing the operation of one parasitic bipolar transistor, based on the structure of suppressing the operation of another parasitic bipolar transistor, according to the embodiment.

As shown in FIG. 29, by further arranging the buried insulators ZOFM in the region between the buried insulator ZOFC and the p-type epitaxial layer PEL, the distance between the buried insulator ZOFC and the p-type epitaxial layer PEL can be longer, which can suppress the operation of the PNP parasitic bipolar transistor.

Third Embodiment

A third example of a semiconductor device having the buried insulators (deep trenches) formed in island shapes in the terminal region will be described.

Figure 30:
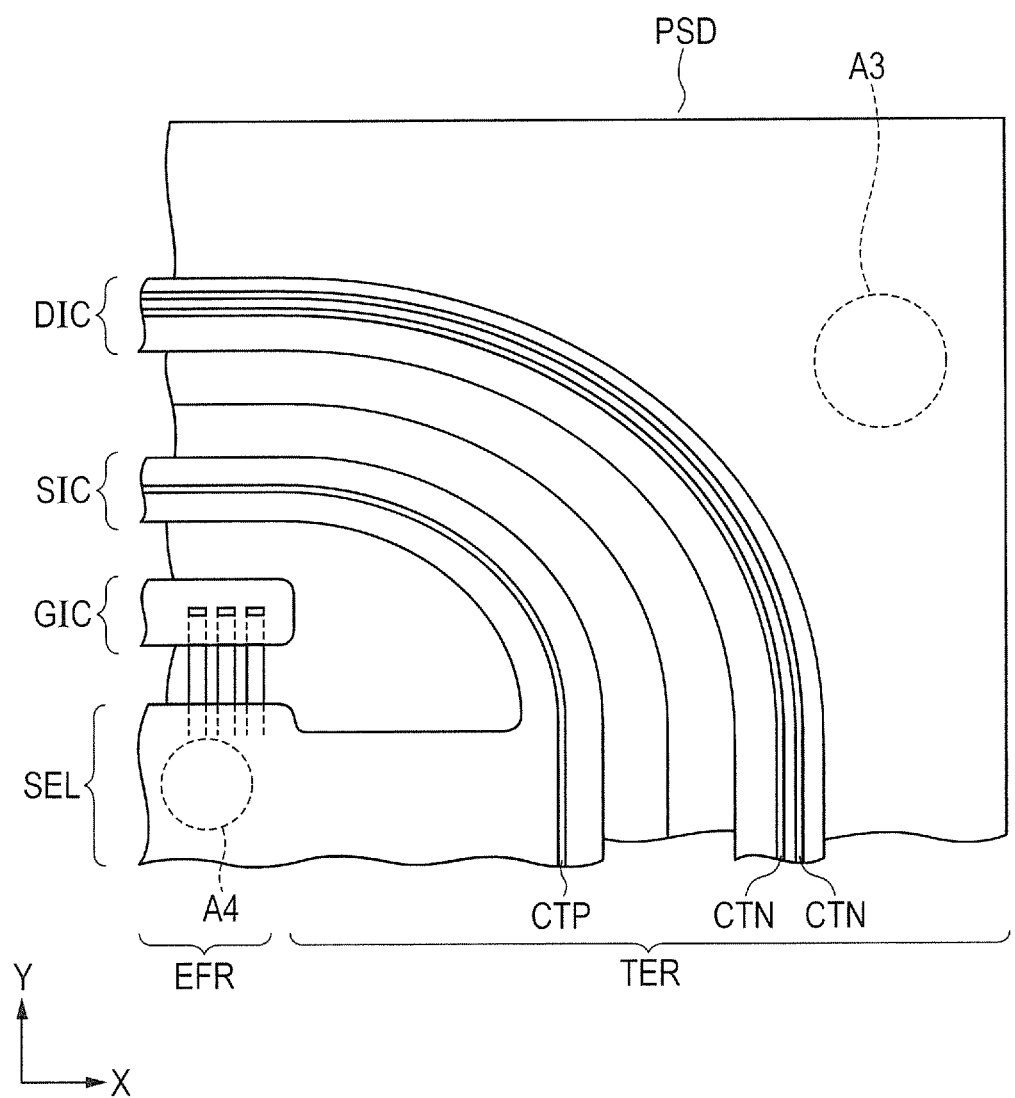
FIG. 30 is a partially enlarged top plan view showing one example of the plane pattern of a semiconductor device according to a third embodiment.
Figure 31:
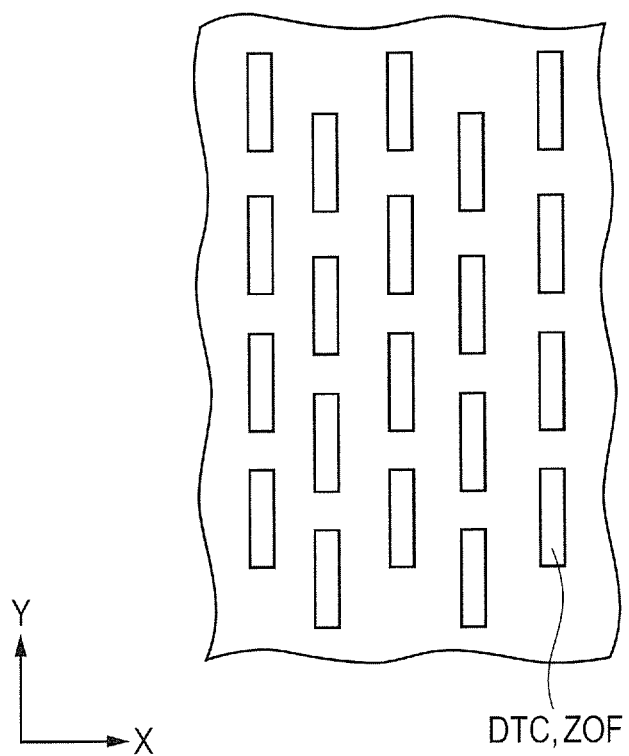
FIG. 31 is a partially enlarged top plan view showing one example of the plane pattern within a dotted frame A3 shown in FIG. 30, according to the embodiment.

As shown in FIGS. 30 and 31, the rectangular buried insulators ZOF (buried insulator rectangle portions) each having a rectangular plane pattern of the buried insulator ZOF are arranged in the terminal region TER of the semiconductor device PSD. Here, the buried insulator ZOF has the long side, for example, along the Y-axis. In other words, in the buried insulator ZOF, the long side is arranged in accordance with the boundary between the scribe region and the terminal region TER.

Figure 32:
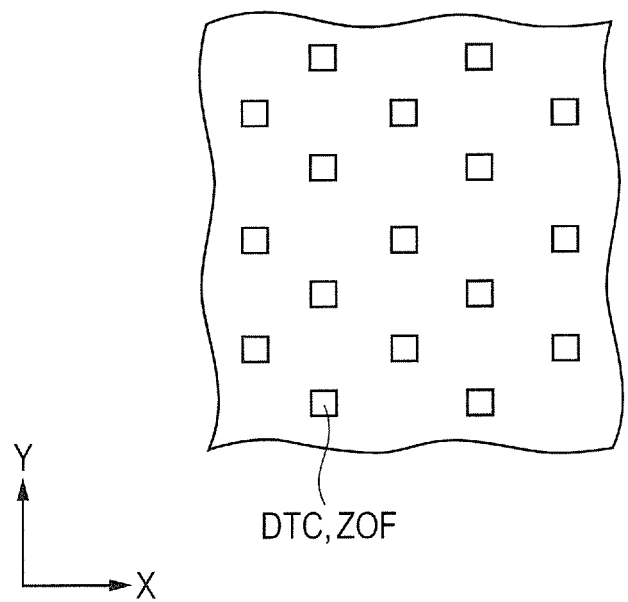
FIG. 32 is a partially enlarged top plan view showing the plane pattern within a dotted frame A4 shown in FIG. 30, according to the embodiment.

As shown in FIG. 32, the buried insulators ZOF are arranged in island shapes in the element region EFR. The other structure than this is the same as the structure of the semiconductor device shown in FIGS. 3 and 4; therefore, the same reference numerals are attached to the same components and the description thereof is not repeated unless necessity arises.

The above-mentioned semiconductor device PSD can be manufactured substantially in the same process as the process shown in FIGS. 5 to 13 having been described in the first embodiment, just by changing the mask pattern in forming the deep trenches DTC.

In the above-mentioned semiconductor device PSD, the buried insulator ZOF having a rectangular plane pattern is arranged in the terminal region TER, as the buried insulator ZOF. Further, the above buried insulator ZOF has the long side along the Y-axis. According to this, in the manufacturing process of the semiconductor device, particularly, when dicing the scribe region in the Y-axis direction, even when chipping occurs, the buried insulator ZOF having the rectangular plane pattern can surely avoid the chipping from spreading to the element region EFR.

(Modified Example)

To take out each semiconductor device formed on the semiconductor substrate as a chip, the semiconductor substrate is provided with a scribe region extending in the X-axis direction and a scribe region extending in the Y-axis direction as the scribe region.

Figure 33:
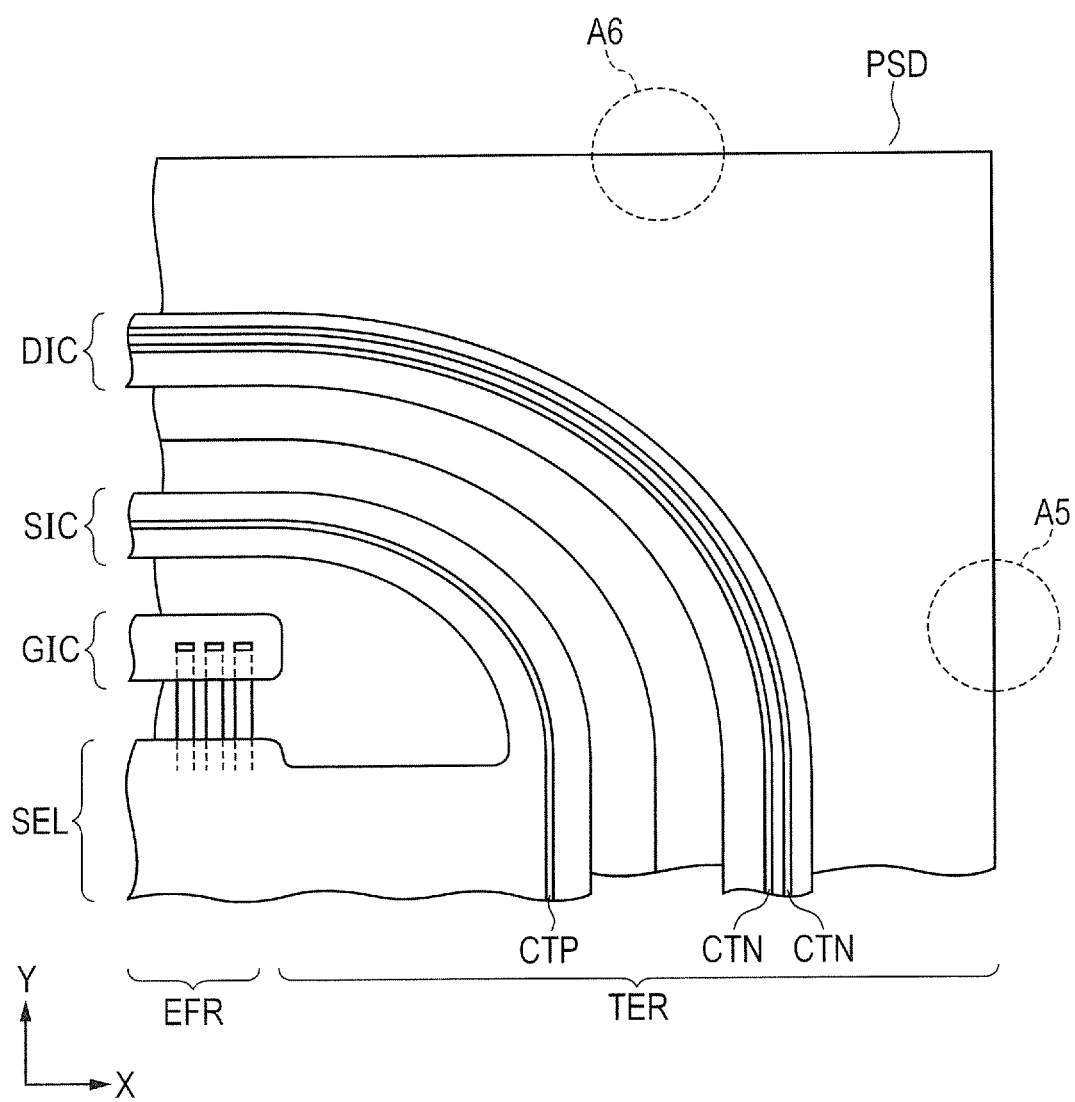
FIG. 33 is a partial top plan view showing one example of the plane pattern of a semiconductor device in a modified example, according to the embodiment.
Figure 34:
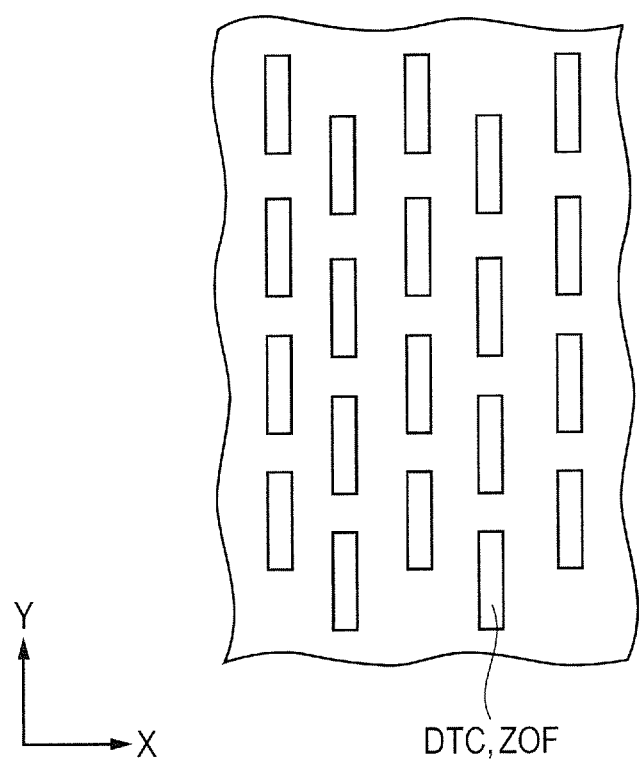
FIG. 34 is a partially enlarged top plan view showing one example of the plane pattern within a dotted frame A5 shown in FIG. 33, according to the embodiment.
Figure 35:
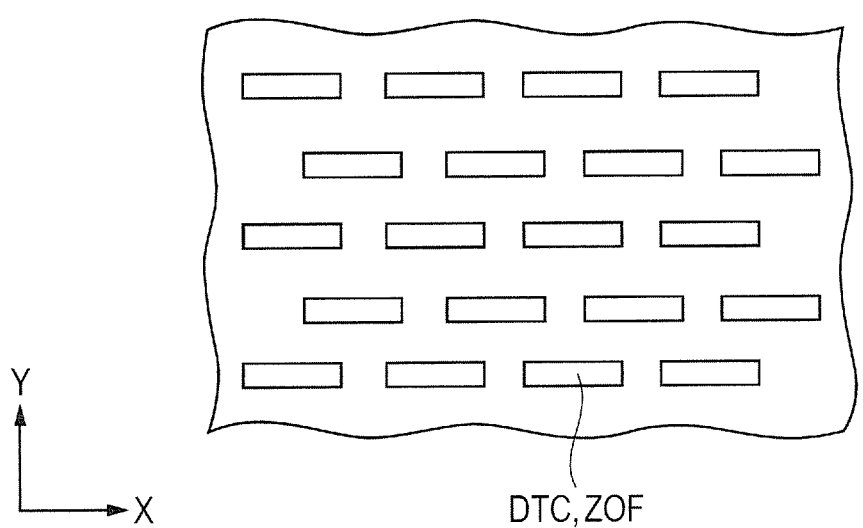
FIG. 35 is a partially enlarged top plan view showing one example of the plane pattern within a dotted frame A6 shown in FIG. 33, according to the embodiment.

In the semiconductor device according to a modified example, as shown in FIGS. 33 and 34, the buried insulator ZOF is arranged to have the long side along the Y-axis (the boundary between the scribe region and the terminal region TER), in the terminal region TER portion positioned near the scribe region extending in the Y-axis direction. On the other hand, as shown in FIGS. 33 and 35, the buried insulator ZOF is arranged to have the long side along the X-axis (the boundary between the scribe region and the terminal region TER), in the terminal region TER positioned near the scribe region extending in the X-axis direction.

In the manufacturing process of the semiconductor device, even when chipping occurs in dicing the scribe regions respectively extending in the Y-axis direction and the X-axis direction, the buried insulator ZOF having the rectangular plane pattern can avoid the chipping from spreading to the element region EFR assuredly.

Fourth Embodiment

Here, a fourth example of a semiconductor device having the buried insulators (deep trenches) arranged in island shapes in the terminal region will be described.

Figure 36:
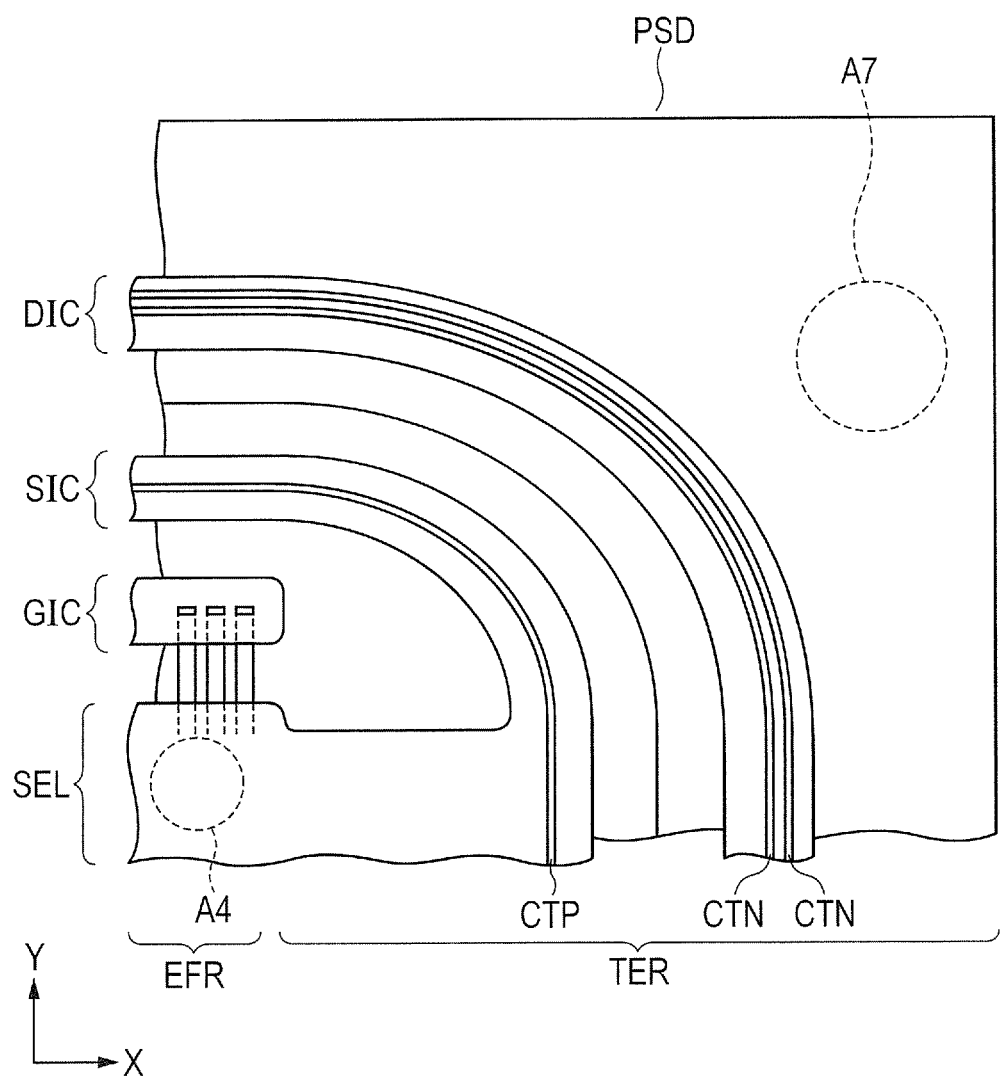
FIG. 36 is a partially enlarged top plan view showing one example of the plane pattern of a semiconductor device according to a fourth embodiment.
Figure 37:
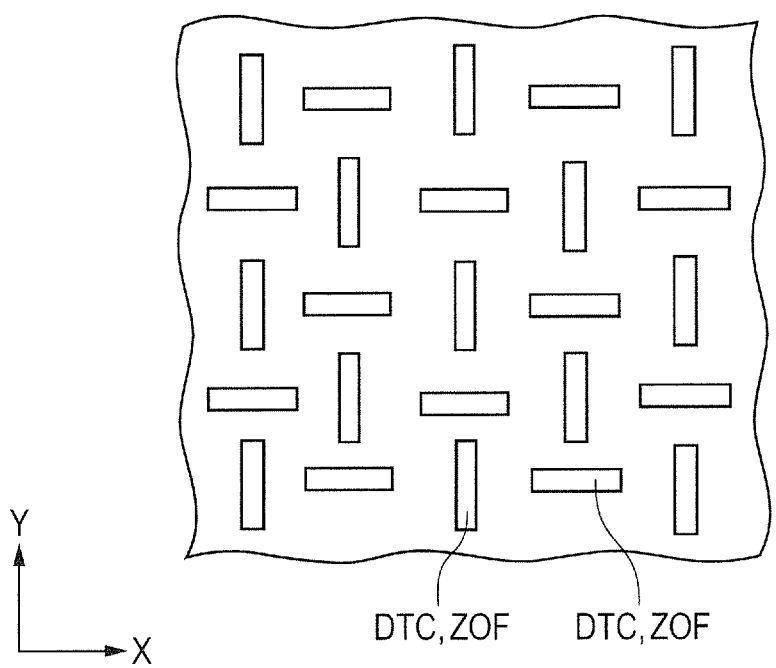
FIG. 37 is a partially enlarged top plan view showing one example of the plane pattern within a dotted frame A7 shown in FIG. 36, according to the embodiment.

As shown in FIGS. 36 and 37, the buried insulators ZOF (buried insulator rectangle portions) each having a rectangular plane pattern are arranged in the terminal region TER of the semiconductor device PSD. Here, as the buried insulator ZOF, the buried insulator ZOF having the long side along the Y-axis and the buried insulator ZOF having the long side along the X-axis are alternately arranged at a distance from each other.

Figure 38:
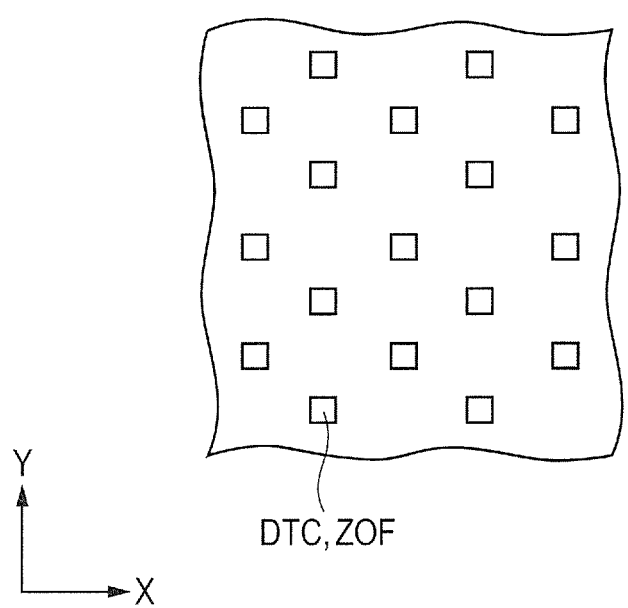
FIG. 38 is a partially enlarged top plan view showing one example of the plane pattern within a dotted frame A4 shown in FIG. 36, according to the embodiment.

As shown in FIG. 38, the buried insulators ZOF are arranged in island shapes in the element region EFR. Other structure than this is the same as the structure of the semiconductor device shown in FIGS. 3 and 4; therefore, the same reference numerals are attached to the same components and the description thereof is not repeated unless necessity arises.

The above-mentioned semiconductor device PSD can be manufactured substantially in the same process as shown in FIGS. 5 to 13 having been described in the first embodiment, just by changing the mask pattern in forming the deep trenches DTC.

In the above-mentioned semiconductor device PSD, the buried insulators ZOF having the long side along the Y-axis and the buried insulators ZOF having the long side along the X-axis are arranged alternately at a distance with each other in the terminal region TER.

According to this, in the manufacturing process of the semiconductor device, even when chipping occurs in dicing the scribe regions extending respectively in the Y-axis direction and the X-axis direction, the buried insulators ZOF can avoid the chipping from spreading to the element region EFR assuredly.

The above-mentioned embodiments have been described taking MOSFET for example as the semiconductor element. As far as the semiconductor element can conduct current between one surface and the other surface of a semiconductor substrate, it is not restricted to MOSFET but, for example, pn diode, Schottky diode, or Insulated Gate Bipolar Transistor (IGBT) may be used.

The semiconductor devices having been described in the embodiments can be properly combined depending on necessity.

As mentioned above, the invention made by the inventor et al. has been described according to the embodiments; however, the invention is not restricted to the embodiments, but it is needless to say that various modifications are possible in the range without departing from the spirit.

What is claimed is:

1. A semiconductor device comprising:
   a semiconductor substrate including a first main surface and a second main surface, which is provided with a substrate of a first conductivity type on a side of the second main surface and a semiconductor layer of a second conductivity type in contact with the above substrate;
   an element region defined on the side of the first main surface of the semiconductor substrate;
   a semiconductor element formed in the element region to conduct current between the first main surface and the second main surface;
   a terminal region defined on the side of the first main surface of the semiconductor substrate and arranged to surround the element region;
   a first region of the first conductivity type formed in the terminal region to arrive at the substrate from the first main surface;
   a plurality of first buried insulators formed in the terminal region to arrive at a first depth from the first main surface; and
   a first column layer of the second conductivity type having a first dopant concentration which is formed in contact with the first region and the respective first buried insulators,
   wherein the first buried insulators are arranged in island shapes mutually at a distance from each other,
   wherein the first buried insulators and the first column layer, which is formed around the first buried insulators, form columnar structures and are disposed in a zigzag form in plan view,
   wherein, in the terminal region, the first buried insulators include:
   a first buried insulator first part nearest to the element region, and a first buried insulator second part positioned far away from the first buried insulator first part in a direction distance from the element region, and wherein a second dopant layer of the second conductivity type arriving at the substrate from the first main surface is formed in the semiconductor substrate region positioned between the first buried insulator first part and the first buried insulator second part.

2. The device according to claim 1, further comprising:
a plurality of second buried insulators formed in the element region to arrive at the first depth from the first main surface;
a second region of the first conductivity type formed in the element region; and
a second column layer of the second conductivity type formed in contact with the second region and the respective second buried insulators,
wherein the second buried insulators are arranged in island shapes mutually at a distance from each other.

3. The device according to claim 2,
wherein, of the first buried insulators, a plurality of the first buried insulator first parts nearest to the element region are arranged at a first pitch,
wherein the second buried insulators are arranged at a second pitch, and
wherein the first pitch is set larger than the second pitch.

4. The device according to claim 1, further comprising:
a first dopant layer of the first conductivity type formed in the terminal region on the first main surface; and
a first electrode formed in contact with the first dopant layer,
wherein the first electrode is electrically coupled to the substrate through the first dopant layer and the first region.

5. The device according to claim 1,
wherein a distance between the first buried insulator first part and the first buried insulator second part is larger than a thickness of the second dopant layer.

6. The device according to claim 1,
wherein the first buried insulators include a plurality of first buried insulator rectangle portions each having long side and short side as a plane pattern, and
wherein the first buried insulator rectangle portions are arranged in that the long sides thereof are in accordance with a boundary between the terminal region and a scribe region.

7. The device according to claim 6,
wherein, of the first buried insulator rectangle portions, the long sides of ones and the short sides of the others are alternately arranged in an intersectional way mutually at a distance from each other.

8. The device according to claim 1, further comprising:
a second electrode formed in the element region on the first main surface,
wherein current is conducted between the second electrode and the substrate through the semiconductor element.

9. A semiconductor device comprising:
a semiconductor substrate including a first main surface and a second main surface, which is provided with a substrate of a first conductivity type on a side of the second main surface and a semiconductor layer of a second conductivity type in contact with the above substrate;
an element region defined on the side of the first main surface of the semiconductor substrate;
a semiconductor element formed in the element region to conduct current between the first main surface and the second main surface;
a terminal region defined on the side of the first main surface of the semiconductor substrate and arranged to surround the element region;
a first region of the first conductivity type formed in the terminal region to arrive at the substrate from the first main surface;
a plurality of first buried insulators formed in the terminal region to arrive at a first depth from the first main surface;
a first column layer of the second conductivity type having a first dopant concentration which is formed in contact with the first region and the respective first buried insulators;
a first dopant layer of the first conductivity type formed in the terminal region on the first main surface of the semiconductor substrate; and
a first electrode formed in contact with the first dopant layer and electrically coupled to the substrate through the first region and the first dopant layer,
wherein the first buried insulators are arranged in island shapes mutually at a distance from each other,
wherein the first buried insulators and the first column layer, which is formed around the first buried insulators, form columnar structures and are disposed in a zigzag form in plan view,
wherein the first buried insulators include a first buried insulator third part positioned in a region where the first electrode is in contact with the first dopant layer,
wherein the first dopant layer is formed extending from the first buried insulator third part toward the element region.

10. The device according to claim 9,
wherein the first buried insulators include first buried insulator fourth part positioned between the first buried insulator third part and the element region.

11. The device according to claim 9,
wherein a first highly concentrated layer of the second conductivity type having a higher dopant concentration than the first dopant concentration is formed protruding from the first column layer in contact with the first buried insulator third part in a direction far away from the first buried insulator.

12. The device according to claim 11, further comprising:
a plurality of second buried insulators formed in the element region to arrive at the first depth from the first main surface;
a second column layer of the second conductivity type having a second dopant concentration formed in contact with the respective second buried insulators, and
a second highly concentrated layer of the second conductivity type having a higher dopant concentration than the second dopant concentration, which is formed protruding from the second column layer in a direction far away from the second buried insulator.

* * * * *